(12) United States Patent
Romero et al.

(10) Patent No.: US 11,555,868 B2
(45) Date of Patent: Jan. 17, 2023

(54) ELECTRONIC CIRCUIT HAVING VERTICAL HALL ELEMENTS ARRANGED ON A SUBSTRATE TO REDUCE AN ORTHOGONALITY ERROR

(71) Applicant: Allegro MicroSystems, LLC, Manchester, NH (US)

(72) Inventors: Hernán D. Romero, Buenos Aires (AR); Gerardo A. Monreal, Buenos Aires (AR); Juan Manuel Cesaretti, Ciudad de Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 20 days.

(21) Appl. No.: 17/238,543

(22) Filed: Apr. 23, 2021

(65) Prior Publication Data
US 2022/0342010 A1    Oct. 27, 2022

(51) Int. Cl.
*G01R 33/07* (2006.01)
*H01L 27/22* (2006.01)

(52) U.S. Cl.
CPC ............ *G01R 33/077* (2013.01); *H01L 27/22* (2013.01)

(58) Field of Classification Search
CPC .............................. G01R 33/077; H01L 27/22
See application file for complete search history.

(56) References Cited

U.S. PATENT DOCUMENTS

| | | | |
|---|---|---|---|
| 7,714,570 B2 | 5/2010 | Thomas et al. | |
| 7,911,203 B2 | 3/2011 | Thomas et al. | |
| 7,994,774 B2 | 8/2011 | Thomas et al. | |
| 8,357,983 B1 | 1/2013 | Wang | |
| 8,749,227 B2 | 6/2014 | Thomas et al. | |
| 8,922,206 B2 | 12/2014 | Friedrich et al. | |
| 9,411,023 B2 | 8/2016 | Friedrich et al. | |
| 9,664,752 B2 | 5/2017 | Monreal et al. | |
| 9,733,106 B2 | 8/2017 | Judkins, III et al. | |
| 9,897,464 B2 | 2/2018 | Judkins, III et al. | |
| 10,120,041 B2 | 11/2018 | Haas et al. | |
| 10,132,879 B2 | 11/2018 | Latham et al. | |
| 10,380,879 B2 | 8/2019 | Haas et al. | |
| 10,520,559 B2 * | 12/2019 | Cesaretti | G01R 33/077 |
| 10,527,703 B2 | 1/2020 | Monreal et al. | |
| 10,852,161 B2 | 12/2020 | Cesaretti et al. | |
| 10,908,232 B2 | 2/2021 | Latham et al. | |
| 2011/0031965 A1 | 2/2011 | Saruki et al. | |
| 2012/0095712 A1 | 4/2012 | Komasaki et al. | |

(Continued)

OTHER PUBLICATIONS

U.S. Appl. No. 16/951,324, filed Nov. 18, 2020, Petrie, et al.

(Continued)

*Primary Examiner* — Reena Aurora
(74) *Attorney, Agent, or Firm* — Daly, Crowley, Mofford & Durkee, LLP

(57) ABSTRACT

An electronic circuit can have a first plurality of vertical Hall elements and a second plurality of vertical Hall elements all disposed on a substrate having a plurality of crystal unit cells, wherein the first plurality of vertical Hall elements have longitudinal axes disposed within five degrees of parallel to an edge of the crystal unit cells, and wherein the second plurality of vertical Hall elements have longitudinal axes disposed between eighty-five and ninety-five degrees relative to the longitudinal axes of the first plurality of vertical Hall elements.

26 Claims, 15 Drawing Sheets

(56) References Cited

U.S. PATENT DOCUMENTS

| | | | |
|---|---|---|---|
| 2014/0175584 A1 | 6/2014 | Foletto et al. | |
| 2015/0346289 A1* | 12/2015 | Ausserlechner | H01L 43/065 324/251 |
| 2015/0377648 A1 | 12/2015 | Sirohiwala et al. | |
| 2016/0011281 A1* | 1/2016 | Sander | H01L 43/065 324/207.2 |
| 2016/0169707 A1 | 6/2016 | Hirota et al. | |
| 2017/0356760 A1 | 12/2017 | David et al. | |
| 2019/0113584 A1 | 4/2019 | Cook et al. | |

OTHER PUBLICATIONS

Haig, "Piezo-Hall Coefficients of n-type Silicon," J. Appl. Plys., vol. 64 No. 1, Jul. 1, 1988; 7 Pages.

Ausserlechner, et al., "Drift of Sensitive Direction Hall-effect Devices in (100)-silicon Caused by Mechanical Shear Stress," Solid-State Electronics, Nov. 2020; 32 Pages.

Streetman, "Solid State Electronic Devices," Prentice-Hall Electrical Engineering Series, 1972, 6 Pages; Part 1 of 2.

Streetman, "Solid State Electronic Devices," Prentice-Hall Electrical Engineering Series, 1972, 4 Pages; Part 2 of 2.

Allegro Microsystems, "A31315 3D Magnetic Position Sensor IC" Datesheet, Mar. 26, 2021; 70 Pages.

Notice of Allowance dated Oct. 19, 2020 for U.S. Appl. No. 16/398,522; 13 Pages.

Search Report and Written Opinion dated Jul. 18, 2022 for PCT Application No. PCT/US2022/020107; 12 pages.

\* cited by examiner

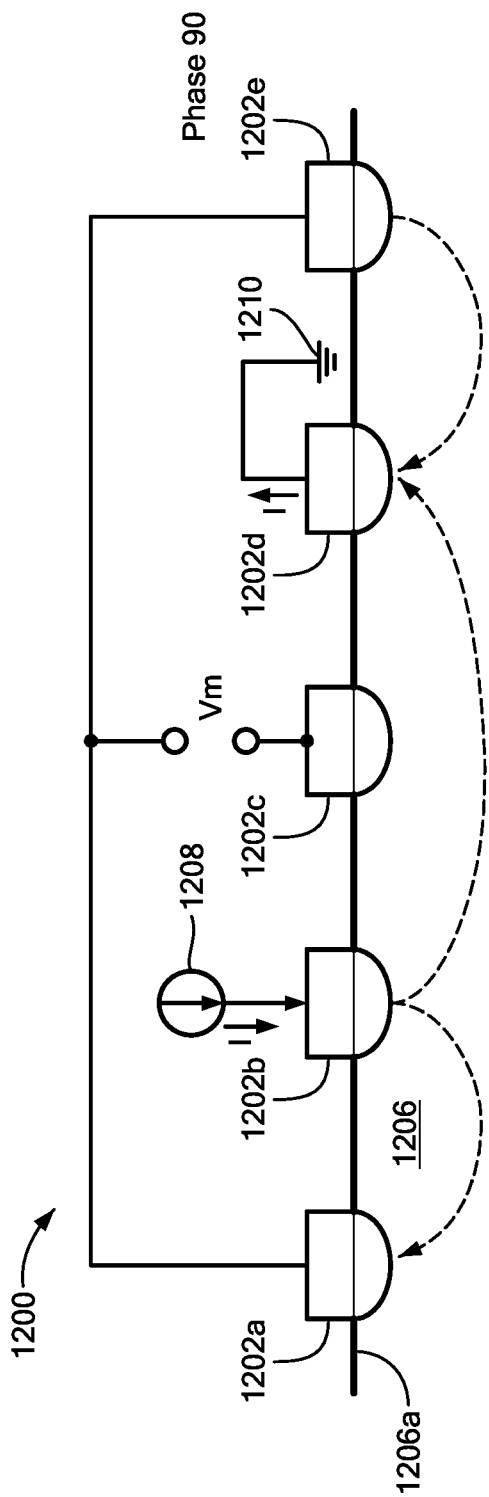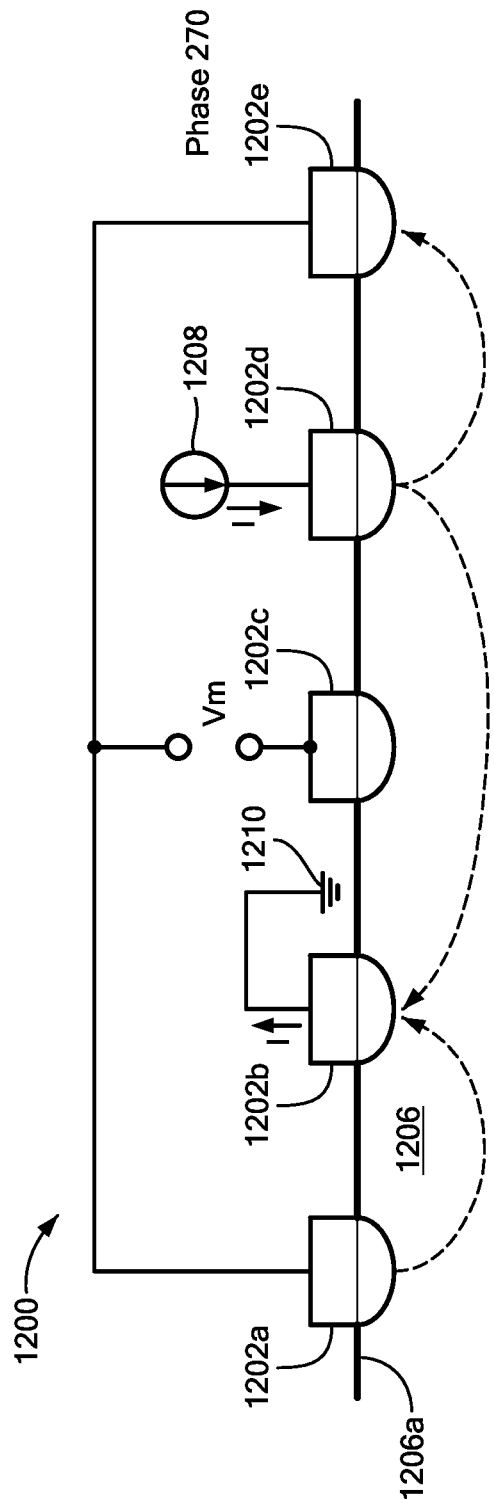

ELECTRONIC CIRCUIT HAVING VERTICAL HALL ELEMENTS ARRANGED ON A SUBSTRATE TO REDUCE AN ORTHOGONALITY ERROR

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to electronic circuits and, more particularly, to electronic circuits having vertical Hall elements arranged on a substrate, the arrangement to reduce an orthogonality error.

BACKGROUND

It is known that conventional silicon substrates have a crystalline structure having a plurality of crystal unit cells. The unit cells have edges parallel to a surface of the substrate.

Conventional vertical Hall elements are arranged on a silicon substrate such that a direction of an axis of largest dimensions of the vertical Hall elements is directed at forty five degrees relative to the edges of the unit cells of the silicon substrate.

A vertical Hall element typically has an axis of maximum sensitivity in a direction ninety degrees away from an axis of a largest dimension of the vertical Hall element, and parallel to the surface of the substrate. Thus, when two vertical Hall elements are arranged at ninety degrees relative of each other, i.e., with axes of largest dimensions parallel to x and y axes of Cartesian coordinates, one of the two vertical Hall elements can be used to sense an x component and the other one of the two vertical Hall elements can be used to sense a y component of a magnetic field.

Several types of errors influence and accuracy of the measurement of the above x and y components.

A first type of error results from a sensitivity mismatch of the two vertical Hall elements arranged as described above. Furthermore, sensitivity error is known to change with time and/or temperature of the vertical Hall elements. However, the sensitivity mismatch type of error can be reduced by way of electronics associated with the two vertical Hall elements, e.g., by way of electronic automatic gain controls electronics or other gain calibration techniques associated with the two vertical Hall elements.

A second type of error results from a DC offset mismatch of the two vertical Hall elements arranged as described above. Furthermore, offset error is known to change with time and/or temperature of the vertical Hall elements. However, the offset mismatch type of error can also be reduced by way of electronics associated with the two vertical Hall elements, e.g., by way of chopper stabilized techniques described more fully below.

A third type of error results from a physical placement error such that the two vertical Hall elements are not physically placed ninety degrees apart. The placement accuracy type of error is static and does not change with time and/or temperature. Thus, this type of error can be reduced by way of a fixed calibration.

A fourth type of error results from so-called orthogonality error, which is not static and which changes with temperature, substrate or package stress, and the like. A used herein, the term "orthogonality" is used to describe a phase difference of first harmonics (in the presence of a rotating magnetic field) between signals generated by the above-described two orthogonally placed magnetic field sensing elements (e.g., vertical Hall elements). As used herein, the term "orthogonality error" (OG error) is defined as the deviation from the ideal phase difference between those two signals (ideally ninety degrees when OG error equals zero).

Orthogonality error resulting from the above-described fourth type of error is known to change with time and/or temperature and/or stress of the two orthogonal vertical Hall elements. Calibration to reduce the influence of this fourth type of orthogonality error has been difficult.

While physical placement error, third type of error, described above can result in some orthogonality error, as described above, the physical placement error is static and can be reduced or eliminated by a fixed calibration.

It would be desirable to provide vertical Hall elements placed in an orthogonal arrangement for which orthogonality error is reduced.

SUMMARY

The present invention provides vertical Hall elements placed in an orthogonal arrangement for which orthogonality error is reduced.

In accordance with an example useful for understanding an aspect of the present invention an electronic circuit can include a substrate having a major surface, the substrate comprising a plurality of unit crystal cells, the plurality of unit crystal cells having a crystal axis parallel to an edge of one of the plurality of unit crystal cells and parallel to the major surface of the substrate. The electronic circuit can also include a first plurality of vertical Hall elements coupled in a first parallel arrangement, each one of the first plurality of vertical Hall elements having a respective longest dimension and a respective shortest dimension parallel to a first axis, the first axis parallel to the major surface of the substrate, wherein the first axis is disposed in a direction of between plus five and minus five degrees relative to the crystal axis, wherein the first plurality of vertical Hall elements taken together has a first geometric centroid on the major surface of the substrate. The electronic circuit can also include a second plurality of vertical Hall elements coupled in a second parallel arrangement, each one of the second plurality of vertical Hall elements having a respective longest dimension and a respective shortest dimension parallel to a second axis, the second axis parallel to the major surface of the substrate, wherein an angle between the first and second axes is between eighty-five and ninety-five degrees, wherein the second plurality of vertical Hall elements taken together has a second geometric centroid on the major surface of the substrate. The first and second centroids have a separation on the major surface of the substrate less than half of the longest dimension plus two times the shortest dimension of any one of the first plurality or the second plurality of vertical Hall elements.

BRIEF DESCRIPTION OF THE DRAWINGS

The foregoing features of the invention, as well as the invention itself may be more fully understood from the following detailed description of the drawings, in which.

DETAILED DESCRIPTION

Figure 2:
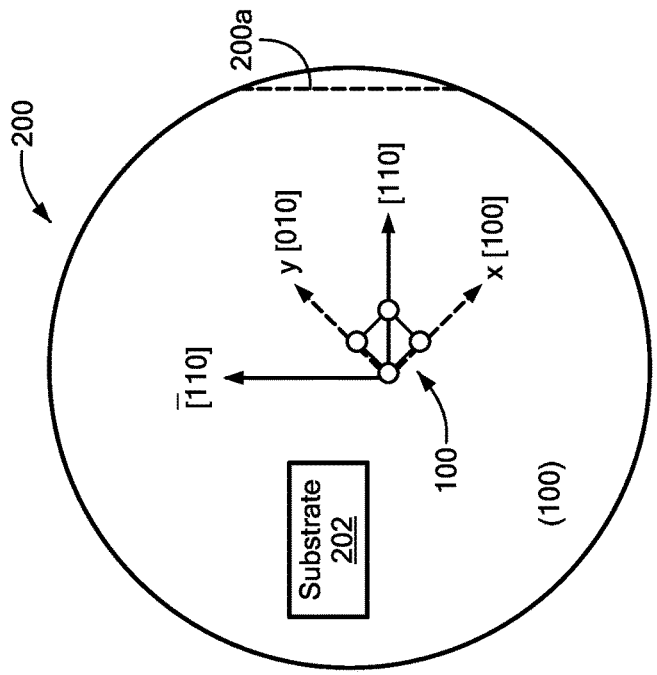
FIG. 2 is a block diagram showing a crystal unit cell within a silicon wafer and showing a chip or substrate portion of the silicon wafer, also referred to as a substrate herein.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, and a vertical Hall element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe an assembly that uses one or more magnetic field sensing elements (part of an electronic circuit) in combination with another electronic circuit portion, all disposed upon a common substrate, e.g., a semiconductor substrate. Magnetic field sensors are used in a variety of applications, including, but not limited to, an angle sensor that senses an angle of a direction of a magnetic field.

As used herein, the term "magnetic field signal" is used to describe any circuit signal that results from a magnetic field experienced by a magnetic field sensing element.

The terms "parallel" and" perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/−ten degrees or +/−five degrees.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be analog or digital.

As used herein, the term "module" can be used to describe a "processor." However, the term "module" is used more generally to describe any circuit that can transform an input signal into an output signal that is different than the input signal.

A processor can contain internal processors or internal modules that perform portions of the function, operation, or sequence of operations of the processor. Similarly, a module can contain internal processors or internal modules that perform portions of the function, operation, or sequence of operations of the module.

A used herein, the term "modulator" is used to describe a circuit or processor that can perform a time domain multiplication of a first signal by a second signal to result in an output signal that has frequency components corresponding to frequency components of the first signal but shifted in frequency.

While electronic circuits shown in figures herein may be shown in the form of analog blocks or digital blocks (e.g., processors or modules), it will be understood that the analog blocks can be replaced by digital blocks (e.g., processors or modules) that perform the same or similar functions and the digital blocks can be replaced by analog blocks that perform the same or similar functions. Analog-to-digital or digital-to-analog conversions may not be explicitly shown in the figures, but should be understood.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "amplifier" is used to describe a circuit element with a gain greater than one, less than one, or equal to one.

As used herein, the terms "line" and "linear" are used to describe either a straight line or a curved line. The line can be described by a function having any order less than infinite.

As described above, orthogonality error is associated with vertical Hall elements physically arranged at ninety degrees relative to each other. As a result of orthogonality error, orthogonally placed vertical Hall elements do behave as if they are orthogonal, and thus, there is an orthogonality error.

As shown below in conjunction with FIG. 5, orthogonality error of orthogonally placed vertical Hall elements can result from behavior of individual vertical Hall elements.

Figure 1:
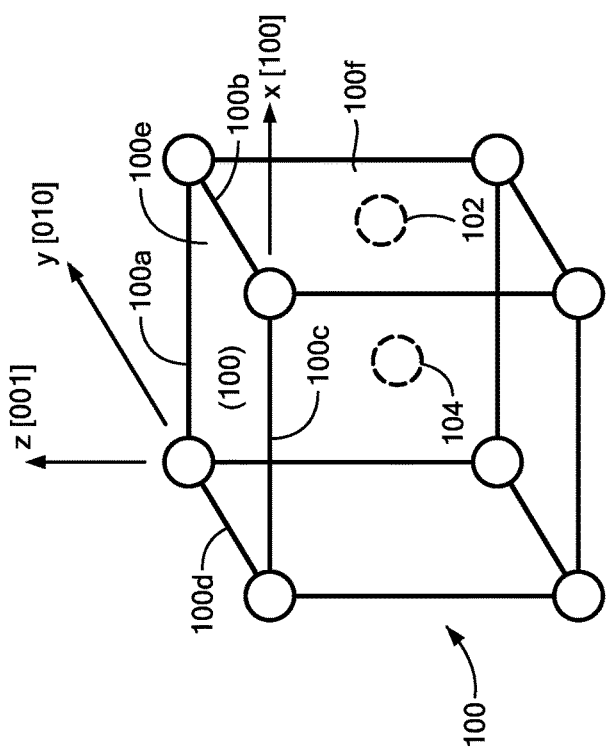
FIG. 1 is a pictorial showing a crystal unit cell of a silicon wafer and substrate.

Referring to FIG. 1, a rectangular unit cell 100 of a crystal, which can be a unit cell within a silicon substrate, can include eight atoms, here shown as circles arranged in a solid rectangular shape. An x axis, a y axis, and a z axis can also be described by so-called Miller indices [100], [010], and [001].

Four edges 100a, 100b, 100c, 100d define a top surface 100e of the unit cell. Using Miller nomenclature, a designation (100) will be recognized to represent a plane of the top surface 100e.

As is known, in general, a unit cell is the smallest crystalline portion that repeats within the crystal. However, there can be other atoms proximate to the unit cell 100, for example, face centered atoms, e.g., a face centered atom 102 disposed in a face of the surface 100f, and also atoms within the body of the unit cell, e.g., an atom 104.

Referring now to FIG. 2, in which like elements of FIG. 1 are shown having like reference designations, a silicon wafer 200 can include a plurality of crystal unit cells, e.g., the crystal unit cell 100, herein shown is a top view having the crystal surface (100) that describes the plane of the surface of the unit cell 100 of the crystal and also the entire largest surface of the silicon substrate 200.

On the surface (100), x and y axes are again shown as in FIG. 1, also represented as [100] and [010] Miller indices. The x and y axes ([100] and [010]) are parallel to edges of the unit cell 100. Other axes designated as [−110] and [110] are also shown, wherein −1 is conventionally designated as a numeral 1 with an overbar. The other axes have angles at forty five degrees relative to edges of the unit cell 100.

An orientation of the wafer 200, i.e., and orientation of crystal unit cells, e.g., 100, can optionally be identified by a flat 200a in the wafer 200a in the [110] direction, or by other means, e.g., by a notch. However, a position of the flat or notch relative to an orientation of the unit cells, e.g., the unit cell 100, is arbitrary and could be at other directions as determined by a substrate manufacturer.

A substrate 202 is indicative of a subdivision of the wafer 200, each one of which can contain an electronic circuit, e.g., a plurality of vertical Hall elements, or a magnetic field sensor that can include a plurality of vertical Hall elements. The chip 202 can also be referred to as a die 202 or a chip 202.

It will be understood that the unit cell 100 and the substrate 202 are not shown to scale relative to the wafer 200, but both are shown larger than normal merely for clarity.

It should also be understood that the coordinate axes shown, the unit cell 100, the substrate 202, and/or the flat 200a, can be rotated by any increment of ninety degrees, whether alone or in combination, and results regarding orthogonality error described below will be the same.

Figure 3:
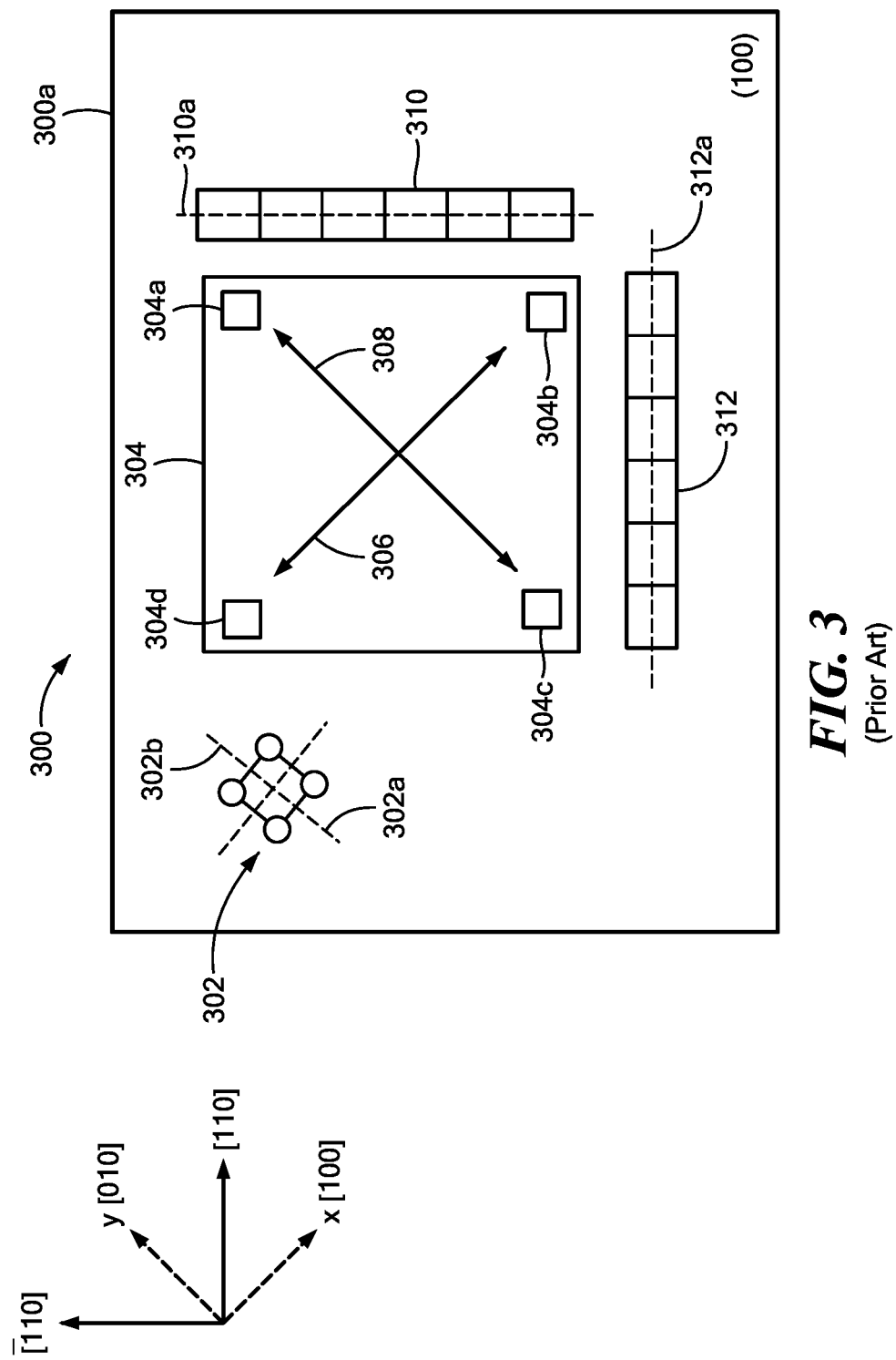
FIG. 3 is a block diagram of a prior art electronic circuit having a silicon substrate, a planar Hall element disposed upon the silicon substrate, two vertical Hall elements disposed upon the silicon substrate, and an electronic circuit portion disposed upon the silicon substrate.

Referring now to FIG. 3, in which like elements of FIGS. 1 and 2 are shown having like reference designations, an electronic circuit 300 can include a substrate 300a, which can be like the substrate 202 of FIG. 2. A unit cell 302 can be like the unit cell 100 of FIGS. 1 and 2. A first unit cell axis 302a can be parallel to two edges of the unit cell 302. A second unit cell axis 302b can be parallel to another two edges of the unit cell 302. The first and second unit cell axes 302a, 302b can be ninety degrees apart.

On the substrate 300a can be disposed a planar Hall element 304 along with first and second vertical Hall elements 310, 312, respectively. The first and second vertical Hall elements 310, 312 can have respective longest dimensions parallel to first and second axes 310a, 312a, respectively, such that the first and second vertical Hall elements 310, 312 are placed at ninety degrees relative to each other.

The planar Hall element can have four contacts, 304a, 304b, 304c, 304d. Bias currents 306, 308 can flow between pairs of contacts 304a, 304c or 304b, 304d. The bias current can be static, or it can rotate between different pairs of the contacts 304a, 304c or 304b, 304d and in different directions in so-called bias current arrangements. When bias current arrangements are sequentially changed, then the planar Hall element experiences current spinning.

Conventionally, the planar Hall element 304 and the first and second vertical Hall elements are disposed relative to the unit cell 302 as shown. Namely, bias current directions 306, 308 within the planar Hall element 304 are aligned to be parallel to the unit cell axes 302a, 302b. Furthermore, first and second axes 310a, 312a of the first and second vertical Hall elements 310, 312 are each at an angle of forty-five degrees relative to the unit cell axis 302a, i.e., at forty-five degrees relative to the first and second unit cell axes 302a, 302b.

It is described below that this conventional arrangement of the vertical Hall elements 310, 312 is not advantageous. As described in conjunction with other figures below, bias currents in the first and second vertical Hall elements 310, 312 tend to flow in a direction somewhat parallel to the axes 310a, 312a. However, as described more fully below, the current directions can be misaligned.

In operation, the first and second vertical Hall elements 310 can be used to sense two orthogonal spatial components of a magnetic field, i.e., in [110] and [−110] directions, but with errors described more fully below. The planar Hall element 304 can be used to sense a third spatial component of the magnetic field. Thus, the three Hall elements can be used to sense a magnitude and a direction of the magnetic field in three dimensions, but with errors.

Figure 4:
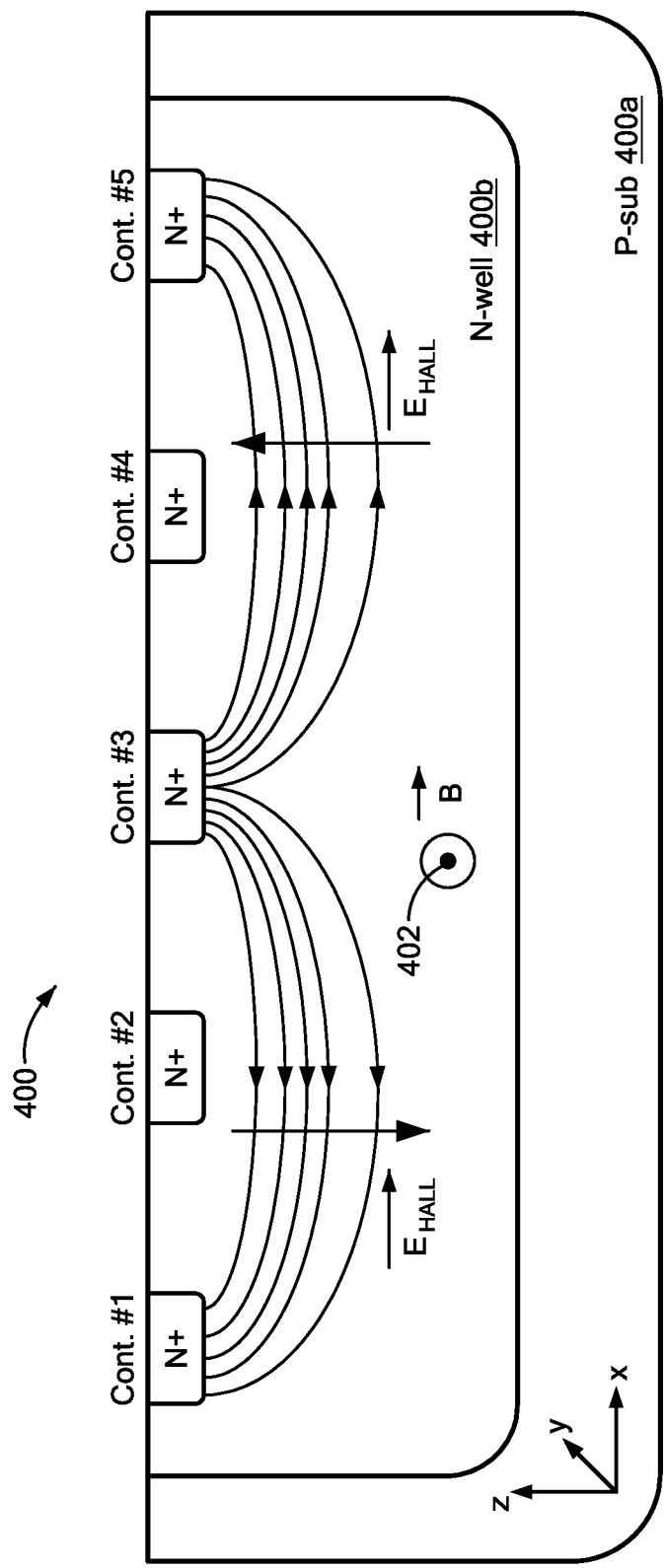
FIG. 4 is a cross section of a vertical Hall element

Referring now to FIG. 4, in a side view, a vertical Hall element 400 can be formed in a P-type substrate, which can be like the substrate 202 of FIG. 2 or like any of the substrates described herein. An N-well region 400b can be implanted and diffused into the substrate 400a. Five N+ type contacts Cont. #1, Cont. #2, Cont. #3, Cont. #4, Cont. #5, can be implanted and diffused into the N-well 400b.

In one particular bias current arrangement, bias currents can be injected into the third contact Cont. #3 and outer contacts Cont. #1, Cont. #5 can be coupled to receive the current, e.g., coupled to a ground voltage. A voltage between contacts Cont. #2 and Cont. #4 results and is responsive to a magnetic field 402, or more particularly, to a projection of a magnetic field onto an axis out of the page. Thus, the vertical Hall element 400 is most responsive to magnetic fields directed along the axis into and out of the page and is least responsive to magnetic fields perpendicular to the direction into and out of the page.

Other bias current arrangements, referred to herein as phases, are described below in conjunction with FIGS. 12-12C.

Figure 5:
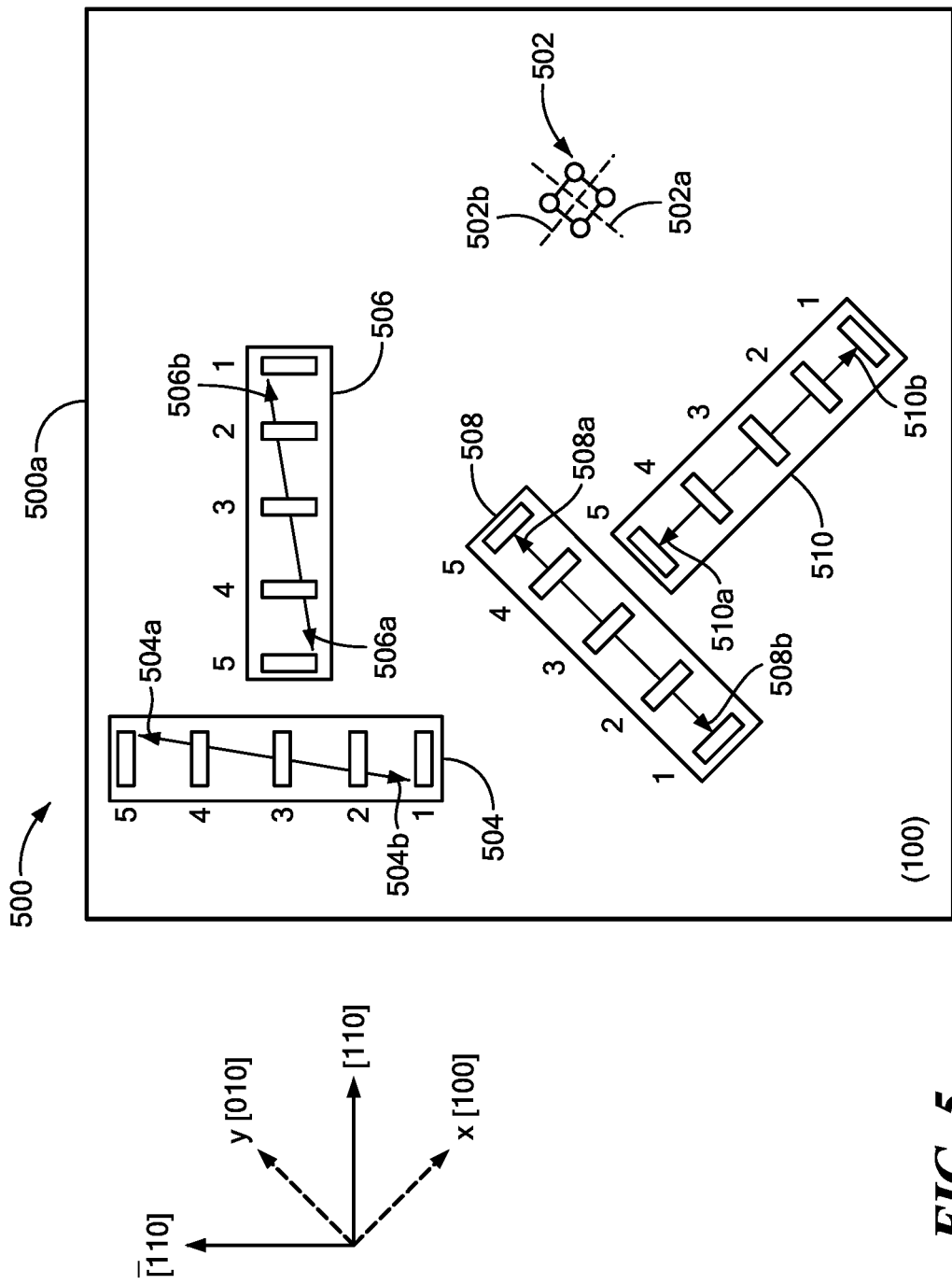
FIG. 5 is a block diagram of an electronic circuit having a silicon substrate and four vertical Hall elements disposed upon the silicon substrate at four different angles relative to a position of a unit cell within the substrate.

Referring now to FIG. 5, in which like elements of FIGS. 1 and 2 are shown having like reference designations, an electronic circuit 500 can include a substrate 500a. The substrate 500a can be comprised of a plurality of unit cells, e.g., 502, each with respective unit cell axes 502a, 502b parallel to respective edges of the unit cell. The unit cell 502 can be like the unit cell 100 of FIGS. 1 and 2.

On the substrate 500a can be disposed a first pair of vertical Hall elements 504, 506 arranged at ninety degrees relative to each other. The first pair of vertical Hall elements 504, 506 are arranged such that respective longitudinal axes are not parallel to the unit cell axes 502a, 502b but instead are at forty-five degrees relative to the unit cell axes 502a, 502b.

On the substrate 500a can also be disposed a second pair of vertical Hall elements 508, 510 arranged at ninety degrees relative to each other. The second pair of vertical Hall elements 504, 506 are arranged such that respective longitudinal axes are parallel to the unit cell axes 502a, 502b.

In a first bias arrangement or phase described above in conjunction with FIG. 4, bias current portions 504a, 504b flow from a center contact of the vertical Hall element 504 to outer contacts of the vertical Hall element 504. Bias current portions 506a, 506b flow from a center contact of the vertical Hall element 506 to outer contacts of the vertical Hall element 506. Bias current portions 508a, 508b flow from a center contact of the vertical Hall element 508 to outer contacts of the vertical Hall element 508. Bias current portions 510a, 510b flow from a center contact of the vertical Hall element 510 to outer contacts of the vertical Hall element 510.

It has been identified that, when the first pair of vertical Hall elements 504, 506 is arranged as shown relative the crystal unit cell 502, the bias current portions 504a, 504b, 506a, 506b are not parallel to the longitudinal axes of the vertical Hall elements 504, 506, respectively. Furthermore, the amount by which the the bias current portions 504a, 504b, 506a, 506b differ in angle from the longitudinal axes of the vertical Hall elements 504, 506 tends to change with stress in the substrate, as may be caused, for example, by temperature changes.

As a result of the bias current portions 504a, 504b, 506a, 506b not being parallel to the ninety degree placement of longitudinal axes of the vertical Hall elements 504, 506, the first pair of vertical Hall element 504, 506 suffers the above-described orthogonality error. The orthogonality error can be large, for example, five to ten degrees apart from ninety degrees.

It has also been identified that, when the second pair of vertical Hall elements 508, 510 is arranged as shown relative the crystal unit cell 502, the bias current portions 508a, 508b, 510a, 510b are substantially parallel to the longitudinal axes of the vertical Hall elements 508, 510, respectively. Furthermore, the amount by which the bias current portions 508a, 508b, 510a, 510b differ in angle from the longitudinal axes of the vertical Hall elements 508, 510 tends to change very little with stress in the substrate, as may be caused, for example, by temperature changes.

As a result of the bias current portions 508a, 508b, 510a, 510b being substantially parallel to the ninety degree placement of longitudinal axes of the vertical Hall elements 508, 510, the second pair of vertical Hall element 508, 510 suffers very little of the above-described orthogonality error. With this arrangement of the second pair of vertical Hall elements 508, 510 relative to the unit cell axes 502a, 502b, the orthogonality error can be small, for example, less than or equal to about +/−0.5 degrees apart from ninety degrees, or less than or equal to about +/−0.2 degrees apart from ninety degrees.

Figure 6:
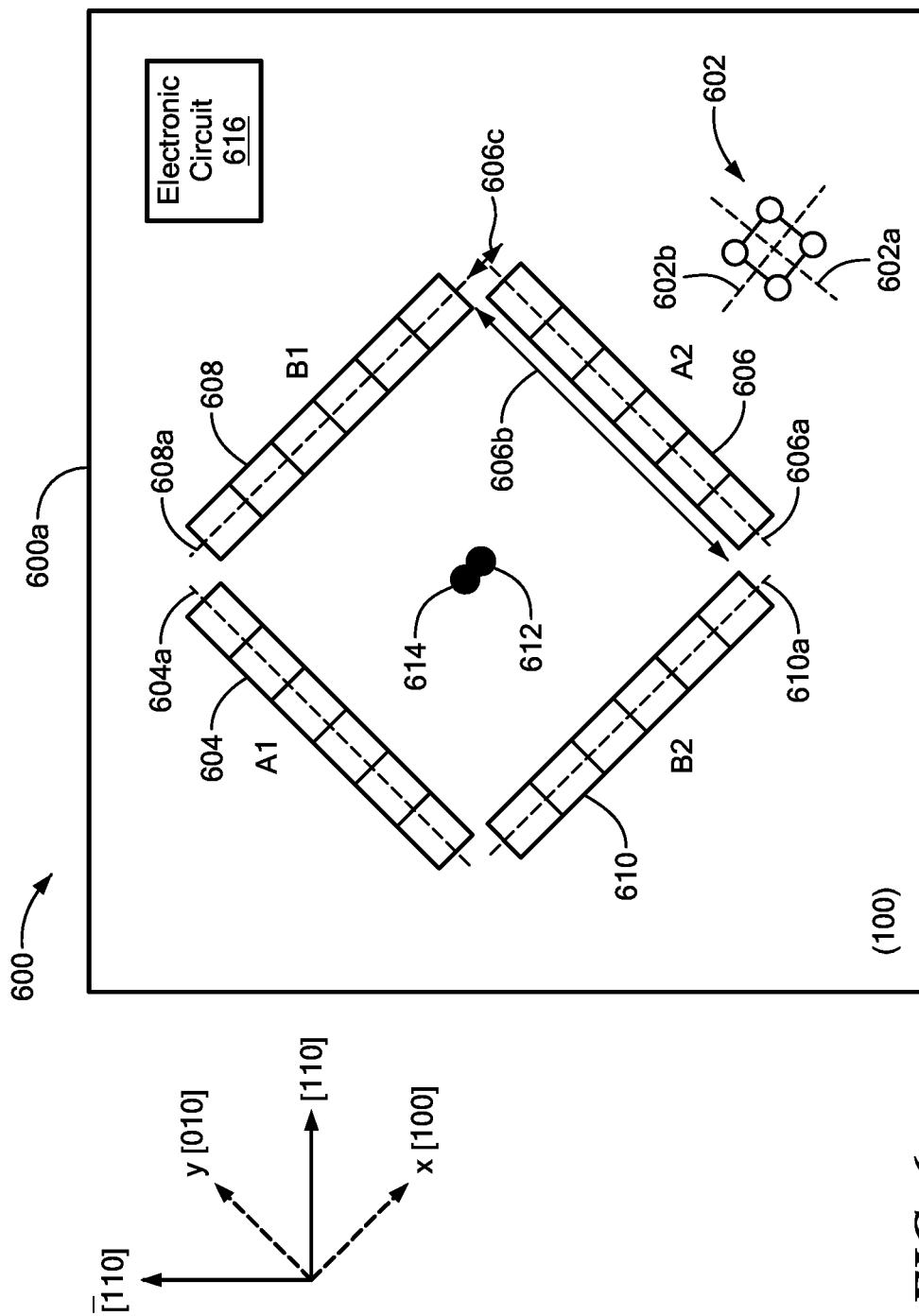
FIG. 6 is a block diagram of another electronic circuit having a silicon substrate, an electronic n disposed upon the silicon substrate, and four vertical Hall elements disposed upon the silicon substrate at two different angles relative to a position of a unit cell within the substrate.

Referring now to FIG. 6, in which like elements of FIGS. 1 and 2 are shown having like reference designations, an electronic circuit 600 can include a substrate 600a, which can be like the substrate 202 of FIG. 2. A unit cell 602 can be like the unit cell 100 of FIGS. 1 and 2. A first unit cell axis 602a can be parallel to two edges of the unit cell 602. A second unit cell axis 602b can be parallel to another two edges of the unit cell 602. The first and second unit cell axes 602a, 602b can be ninety degrees apart.

On the substrate 600a can be disposed a first plurality of vertical Hall elements 604, 606 coupled in a first parallel arrangement by an electronic circuit portion 616 also disposed upon the substrate 600a. Each one of the first plurality of vertical Hall elements 604, 606 can have a respective longest dimension, e.g., 606b, and a respective shortest dimension, e.g., 606c, parallel to a first axis 604a or 606a. The first axis 604a or 606a can be parallel to a major surface of the substrate 600a. The first axis 604a or 606a is disposed in a direction of between plus five and minus five degrees relative to the crystal axis 602a. Preferably, the first axis 604a or 606a is disposed in a direction parallel to the crystal axis 602a. The first plurality of vertical Hall elements 604, 606 taken together has a first geometric centroid 612 on the major surface of the substrate 600a.

On the substrate 600a can also be disposed a second plurality of vertical Hall elements 608, 610 coupled in a second parallel arrangement by the electronic circuit portion 616. Each one of the second plurality of vertical Hall elements 608, 610 can have a respective longest dimension and a respective shortest dimension parallel to a second axis 608a or 610a. The second axis 608a or 610a can be parallel to the major surface of the substrate 600a. An angle between the first axis 604a or 606a and the second axis 608a or 610a can be between eighty-five and ninety-five degrees. Preferably, the angle between the first axis 604a or 606a and the second axis 608a or 610a is ninety degrees.

The second plurality of vertical Hall elements 608, 610 taken together has a second geometric centroid 614 on the major surface of the substrate. The first and second centroids 612, 614 can have a separation on the major surface of the substrate 600a less than half of the longest dimension plus two times the shortest dimension of any one of the first plurality of vertical Hall elements 604, 606 or the second plurality of vertical Hall elements 608, 610. In some embodiments, the first and second centroids 612, 614 can have a separation on the major surface of the substrate 600a less than half of the longest dimension of any one of the first plurality of vertical Hall elements 604, 606 or the second plurality of vertical Hall elements 608, 610. In some embodiments, the first and second centroids 612, 614 are coincident.

In operation, with the electronic circuit portion 616, the first plurality of vertical Hall elements 604, 606 and the second plurality of vertical Hall elements 608, 610 can be used to sense two orthogonal spatial components of a magnetic field, i.e., in [100] and [010] directions. Only small orthogonality errors, and small changes of orthogonality errors due to stress, result from the arrangement shown, for reasons described above in conjunction with FIG. 5.

Further operation of the electronic circuit 600, and of the electronic circuit portion 616, is described in conjunction with FIGS. 13-15 below. However, it should be understood that, in combining the first plurality of vertical Hall elements 604, 606 and in combining the second plurality of vertical Hall elements 608, 610, the first plurality of vertical Hall elements 604, 606 can use current spinning and can have different current spinning phases (also referred to herein as bias current phases) at any time of combination, and the second plurality of vertical Hall elements 608, 610 can also use current spinning and can have different current spinning phases at any time of combination. In some other embodiments, the different current spinning phases can be one hundred eighty degrees apart using the phase nomenclature designation of FIGS. 12, 12A, 12B and 12C. In some embodiments, the different current spinning phases can be ninety degrees apart using the phase nomenclature designation of FIGS. 12, 12A, 12B and 12C. In some other embodiments, current spinning is not used, yet still the above different phases can be used in a static bias current phase arrangement.

Combinations using different phases can result in lower offset voltages of the combined vertical Hall elements, whether used in a current spinning arrangement or in a static arrangement without current spinning. However, in some other embodiments, the phases are the same in the first plurality of vertical Hall elements 604, 606 and in the second plurality of vertical Hall elements 608, 610, and the arrangement can be static without current spinning.

While the first plurality of vertical Hall elements 604, 606 includes two vertical Hall elements and the second plurality of vertical Hall elements 608, 610 includes two vertical Hall elements, in other arrangements described below, each plurality of vertical Hall elements can include more than two vertical Hall elements.

Figure 7:
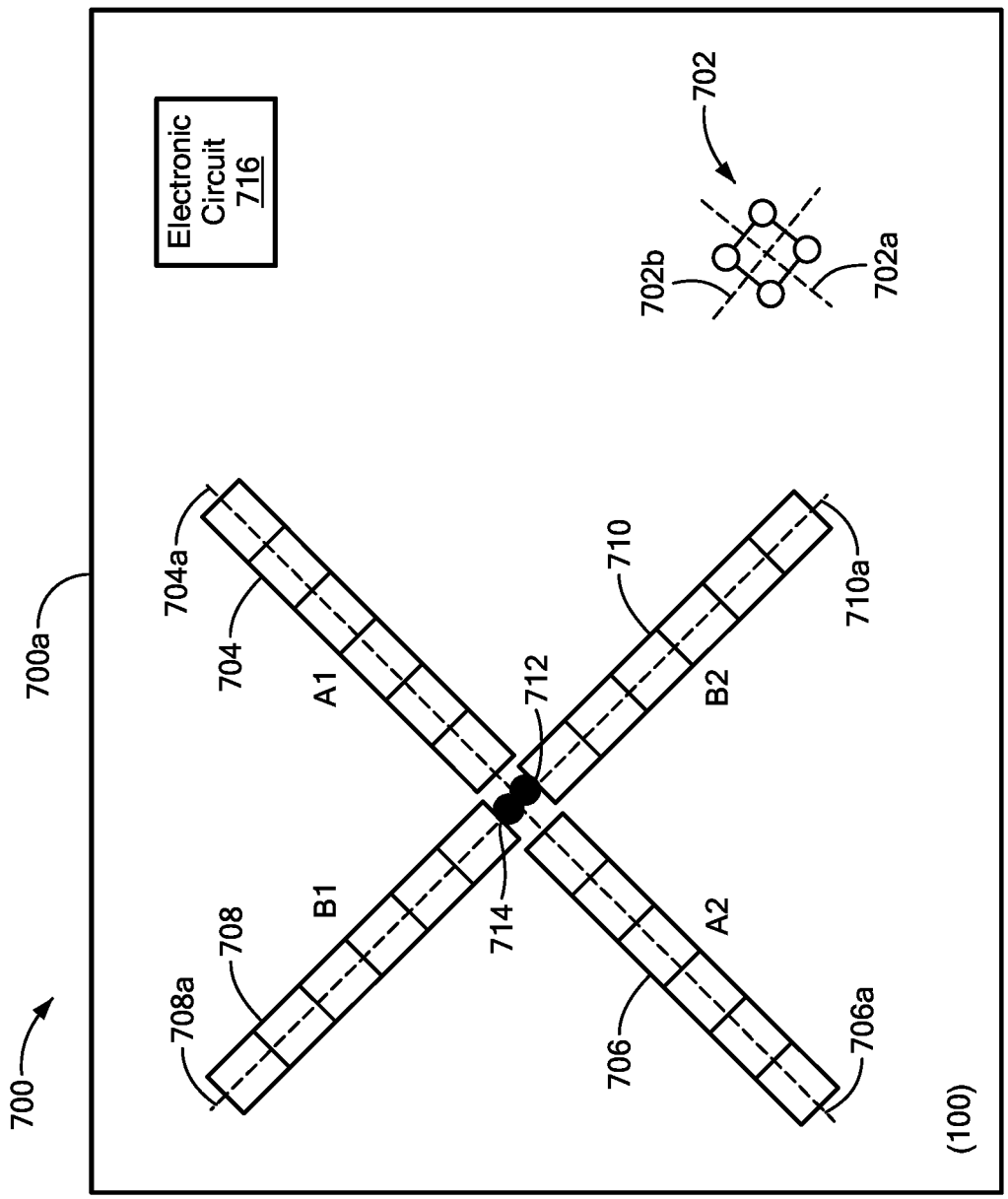
FIG. 7 is a block diagram of another circuit having a silicon substrate, an electronic circuit portion disposed upon the silicon substrate, and four vertical Hall elements disposed upon the silicon substrate at two different angles relative to a position of a unit cell within the substrate.

Referring now to FIG. 7, in which like elements of FIGS. 1 and 2 are shown having like reference designations, an electronic circuit 700 can include a substrate 700a, which can be like the substrate 202 of FIG. 2. A unit cell 702 can be like the unit cell 100 of FIGS. 1 and 2. A first unit cell axis 702a can be parallel to two edges of the unit cell 702. A second unit cell axis 702b can be parallel to another two edges of the unit cell 702. The first and second unit cell axes 702a, 702b can be ninety degrees apart.

On the substrate 700a can be disposed a first plurality of vertical Hall elements 704, 706 coupled in a first parallel arrangement by an electronic circuit portion 716 also disposed upon the substrate 700a. Each one of the first plurality of vertical Hall elements 704, 706 can have a respective longest dimension and a respective shortest dimension parallel to a first axis 704a or 706a. The first axis 704a or 706a can be parallel to a major surface of the substrate 700a. The first axis 704a or 706a is disposed in a direction of between plus five and minus five degrees relative to the crystal axis 702a. Preferably, the first axis 704a or 706a is disposed in a direction parallel to the crystal axis 702a. The first plurality of vertical Hall elements 704, 706 taken together has a first geometric centroid 712 on the major surface of the substrate 700a.

On the substrate 700a can also be disposed a second plurality of vertical Hall elements 708, 710 coupled in a second parallel arrangement by the electronic circuit portion 716. Each one of the second plurality of vertical Hall elements 708, 710 can have a respective longest dimension and a respective shortest dimension parallel to a second axis 708a or 710a. The second axis 708a or 710a can be parallel to the major surface of the substrate 700a. An angle between the first axis 704a or 706a and the second axis 708a or 710a is between eighty-five and ninety-five degrees. Preferably, the angle between the first axis 704a or 706a and the second axis 708a or 710a is ninety degrees.

The second plurality of vertical Hall elements 708, 710 taken together has a second geometric centroid 714 on the major surface of the substrate. The first and second centroids 712, 714 can have a separation on the major surface of the substrate 700a less than half of the longest dimension plus two times the shortest dimension of any one of the first plurality of vertical Hall elements 704, 706 or the second plurality of vertical Hall elements 708, 710. In some embodiments, the first and second centroids 712, 714 can have a separation on the major surface of the substrate 700a less than half of the longest dimension of any one of the first plurality of vertical Hall elements 704, 706 or the second plurality of vertical Hall elements 708, 710. In some embodiments, the first and second centroids 712, 714 are coincident.

In operation, with the electronic circuit portion 716, the first plurality of vertical Hall elements 704, 706 and the second plurality of vertical Hall elements 708, 710 can be used to sense two orthogonal spatial components of a magnetic field, i.e., in [100] and [010] directions. Only small orthogonality errors, and small changes of orthogonality errors due to stress, result from the arrangement shown, for reasons described above in conjunction with FIG. 5.

Further operation of the electronic circuit 700, and of the electronic circuit portion 714, is described in conjunction with FIGS. 13-15 below. However, it should be understood that, in combining the first plurality of vertical Hall elements 704, 706 and in combining the second plurality of vertical Hall elements 708, 710, the first plurality of vertical Hall elements 704, 706 can use current spinning and can have different current spinning phases at any time of combination, and the second plurality of vertical Hall elements 708, 710 can use current spinning and can also have different current spinning phases at any time of combination. In some embodiments, the different current spinning phases can be one hundred eighty degrees apart using the phase nomenclature designation of FIGS. 12, 12A, 12B and 12C. In some other embodiments, the different current spinning phases can be ninety degrees apart using the phase nomenclature designation of FIGS. 12, 12A, 12B and 12C. In some other embodiments, current spinning is not used, yet still the above different phases can be used in a static phase arrangement.

Combinations using different phases can result in lower offset voltages of the combined vertical Hall elements, whether used in a current spinning arrangement or in a static arrangement without current spinning. However, in some other embodiments, the phases are the same in the first plurality of vertical Hall elements 704, 706 and in the second plurality of vertical Hall elements 708, 710, and the arrangement can be static without current spinning.

While the first plurality of vertical Hall elements 704, 706 includes two vertical Hall elements and the second plurality of vertical Hall elements 708, 710 includes two vertical Hall elements, in other arrangements described below, each plurality of vertical Hall elements can include more than two vertical Hall elements.

Figure 8:
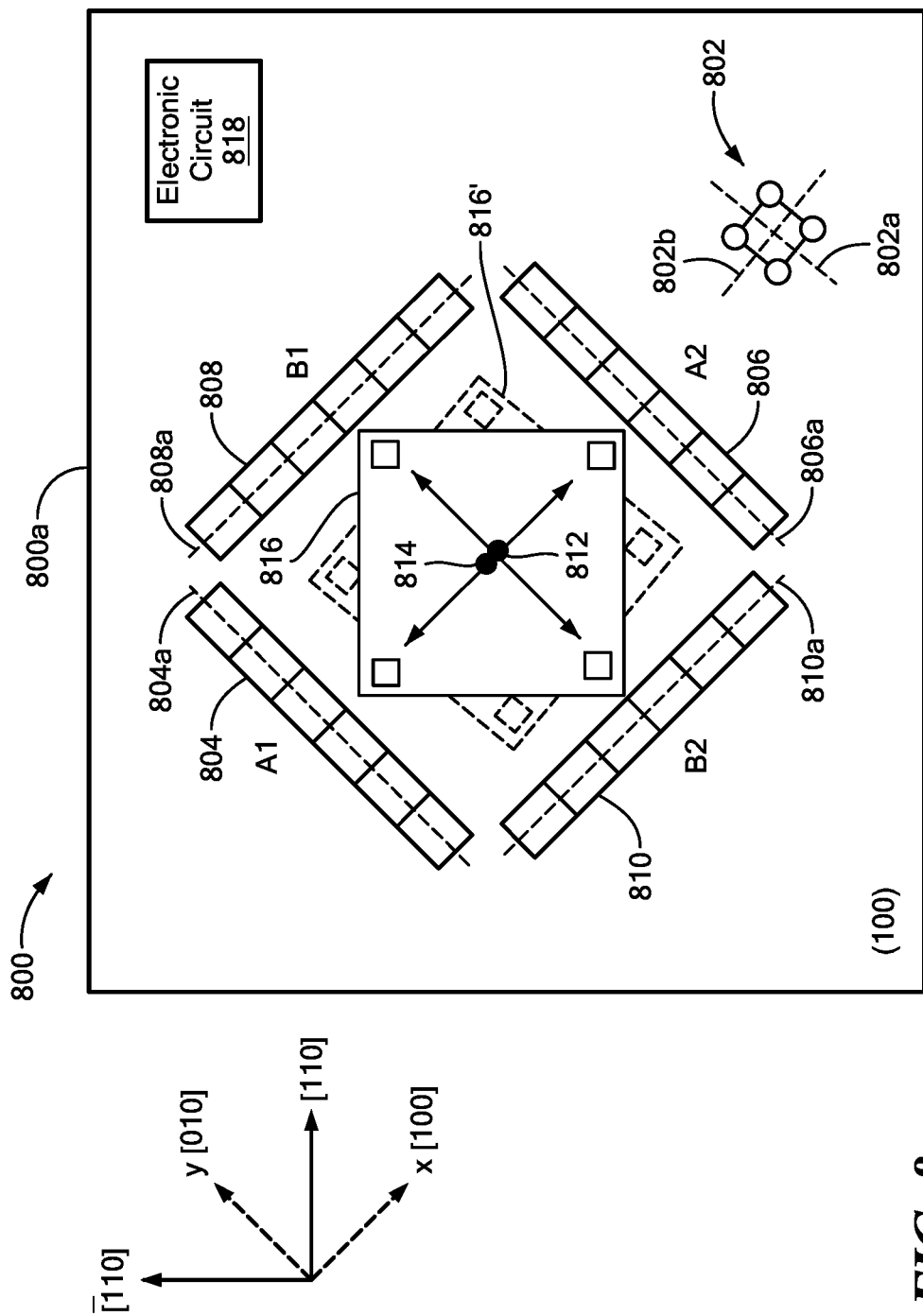
FIG. 8 is a block diagram of another electronic circuit having a silicon substrate, an electronic circuit portion disposed upon the silicon substrate, a planar Hall element disposed upon the silicon substrate, and four vertical Hall elements disposed upon the silicon substrate at two different angles relative to a position of a unit cell within the substrate.

Referring now to FIG. 8, in which like elements of FIGS. 1 and 2 are shown having like reference designations, an electronic circuit 800 can be disposed upon a substrate 800a.

A first plurality of vertical Hall elements 804, 806 with axes 804a, 806a, respectively, and a second plurality of vertical Hall elements 808, 810 with axes 808a, 810a respectively, can be disposed upon the substrate 800a and can be the same as or similar to the first plurality of vertical Hall elements 604, 606 with axes 604a, 606a and the second plurality of vertical Hall elements 608, 610 with axes 6081, 610a of FIG. 6, so are not discussed further here.

Centroids 812, 814 can be the same as or similar to the centroids 612, 614 of FIG. 6.

A planar Hall element 816 can also be disposed upon the substrate 800a.

The first plurality of vertical Hall elements 804, 806 is most responsive in a direction perpendicular to the axes 804a, 806a, respectively. The second plurality of vertical Hall elements 808, 810 is most responsive in a direction perpendicular to the axes 808a, 810a, respectively.

In operation, with an electronic circuit portion 818, the first plurality of vertical Hall elements 804, 806 and the second plurality of vertical Hall elements 808, 810 can be used to sense two orthogonal spatial components of a magnetic field, i.e., in [100] and [010] directions. with error greatly reduced from those of FIG. 3. The planar Hall element 816 can be used to sense a third spatial component of the magnetic field. Thus, the three Hall elements can be used to sense a magnitude and a direction of the magnetic field in three dimensions with reduced errors.

In other embodiments, the planar Hall element 816 can be disposed at a different rotation relative to the crystal unit cell 802, identified in phantom lines and as a planar Hall element 816'. This rotation is not conventional. Figures below show various planar Hall elements, each having the rotational position of the planar Hall element 816. It should be recognized that any of the planar Hall elements shown and described in figures below can, in other embodiments, be disposed at rotations like the Hall element 816'.

Figure 9:
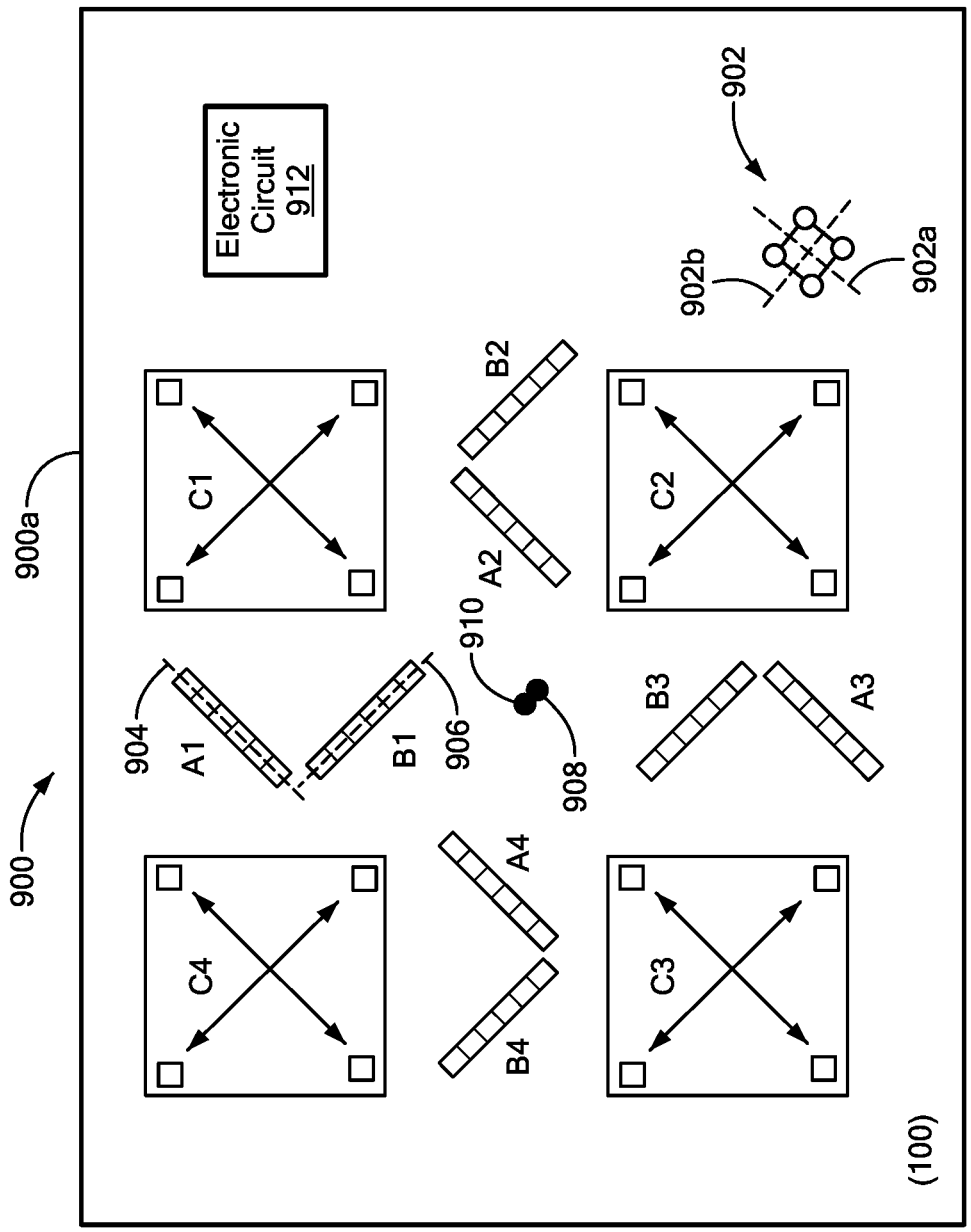
FIG. 9 is a block diagram of another electronic circuit having a silicon substrate, an electronic circuit portion disposed upon the silicon substrate, four planar Hall elements disposed upon the silicon substrate, and eight vertical Hall elements disposed upon the silicon substrate at two different angles relative to a position of a unit cell within the substrate.
Figure 9:
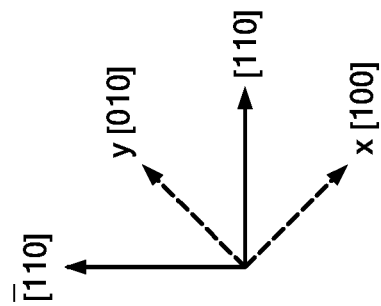

Referring now to FIG. 9, in which like elements of FIGS. 1 and 2 are shown having like reference designations, an electronic circuit 900 can include a substrate 900a, which can be like the substrate 202 of FIG. 2. A unit cell 902 can be like the unit cell 100 of FIGS. 1 and 2. A first unit cell axis 902a can be parallel to two edges of the unit cell 902. A second unit cell axis 902b can be parallel to another two edges of the unit cell 902. The first and second unit cell axes 902a, 902b can be ninety degrees apart.

On the substrate 900a can be disposed a first plurality of vertical Hall elements A1-A4 coupled in a first parallel arrangement by an electronic circuit portion 912 also disposed upon the substrate 900a. Each one of the first plurality of vertical Hall elements A1-A4 can have a respective longest dimension and a respective shortest dimension parallel to a first axis 904, the first axis 904 also parallel to a major surface of the substrate 900a. The first axis 904 is disposed in a direction of between plus five and minus five degrees relative to the crystal axis 902a. Preferably, the first axis 904 is disposed in a direction parallel to the crystal axis 902a. The first plurality of vertical Hall elements A1-A4 taken together has a first geometric centroid 908 on the major surface of the substrate 900a.

On the substrate 900a can also be disposed a second plurality of vertical Hall elements B1-B4 coupled in a second parallel arrangement by the electronic circuit portion 912. Each one of the second plurality of vertical Hall elements B1-B4 can have a respective longest dimension and a respective shortest dimension parallel to a second axis 906, the second axis 906 also parallel to the major surface of the substrate 900a. An angle between the first axis 904 and the second axis 906 is between eighty-five and ninety-five degrees. Preferably, the angle between the first axis 904 and the second axis 906 is ninety degrees.

The second plurality of vertical Hall elements B1-B4 taken together has a second geometric centroid 910 on the major surface of the substrate. The first and second centroids 908, 910 can have a separation on the major surface of the substrate 900a less than half of the longest dimension plus two times the shortest dimension of any one of the first plurality of vertical Hall elements A1-A4 or the second plurality of vertical Hall elements B1-B4. In some embodiments, the first and second centroids 908, 910 can have a separation on the major surface of the substrate 900a less than half of the longest dimension of any one of the first plurality of vertical Hall elements A1-A4 or the second plurality of vertical Hall elements B1-B4. In some embodiments, the first and second centroids 908, 910 are coincident.

Also disposed upon the substrate 900a can be a plurality of planar Hall elements C1-C4 coupled in a first parallel arrangement by an electronic circuit portion 912 also disposed upon the substrate 900a. The plurality of planar Hall elements C1-C4 taken together has a third geometric centroid (not shown) on the major surface of the substrate 900a. The third centroid can be coincident with the first centroid 908, with the second centroid 910, or with both when they are coincident with each other.

In operation, with the electronic circuit portion 912, the first plurality of vertical Hall elements A1-A4 and the second plurality of vertical Hall elements B1-B4 can be used to sense two orthogonal spatial components of a magnetic field, i.e., in [100] and [010] directions. Only small orthogonality errors, and small changes of orthogonality errors due to stress, result from the arrangement shown, for reasons described above in conjunction with FIG. 5.

In operation, with the electronic circuit portion 912, the plurality of planar Hall elements C1-C4 can be used to sense a third spatial component of the magnetic field, i.e., in a [001] direction, orthogonal to the other two spatial components. Thus, the electronic circuit 900 can be used to sense an amplitude and a direction of a magnetic field in three dimensions. However, in other embodiments, the plurality of planar Hall elements C1-C4 are omitted and the electronic circuit 900 is used to sense an amplitude and direction of the magnetic field in only two dimensions parallel to a surface of the substrate 900a.

Examples of electronic circuit portions similar to the electronic circuit portion 912 are shown below in conjunction with FIGS. 13-15.

In other embodiments, the first plurality of vertical Hall elements can consist of only two vertical Hall elements, can consist of only three vertical Hall elements, or can include more than four vertical Hall elements. Similarly, the second plurality of vertical Hall elements can consist of only two vertical Hall elements, can consist of only three vertical Hall elements, or can include more than four vertical Hall elements. In other embodiments, there can be one, two, three of more than four planar Hall elements.

Further operation of the electronic circuit 900, and of the electronic circuit portion 914, is described in conjunction with FIGS. 13-15 below. However, it should be understood that, in combining the first plurality of vertical Hall elements A1-A4 and in combining the second plurality of vertical Hall elements B1-B4, the first plurality of vertical Hall elements A1-A4 can use current spinning and can have different current spinning phases at any time, and the second plurality of vertical Hall elements B1-B4 can also use current spinning and can have different current spinning phases at any time. In some embodiments, the different current spinning phases can be ninety degrees apart using the phase nomenclature designation of FIGS. 12, 12A, 12B and 12C. In some other embodiments, current spinning is not used, yet still the above different phases can be used in a static phase arrangement.

Combinations using different phases can result in lower offset voltages of the combined vertical Hall elements, whether used in a current spinning arrangement or in a static arrangement without current spinning. In some other embodiments, the phases are the same in the first plurality of vertical Hall elements A1-A4 and in the second plurality of vertical Hall elements B1-B4, and the arrangement can be static without current spinning. The plurality of planar Hall elements C1-C4 can have similar combinations of phases and/or current spinning, as will be understood.

It should be understood the elements of the electronic circuit 900 are not shown to scale but are sized according to clarity.

Figure 10:
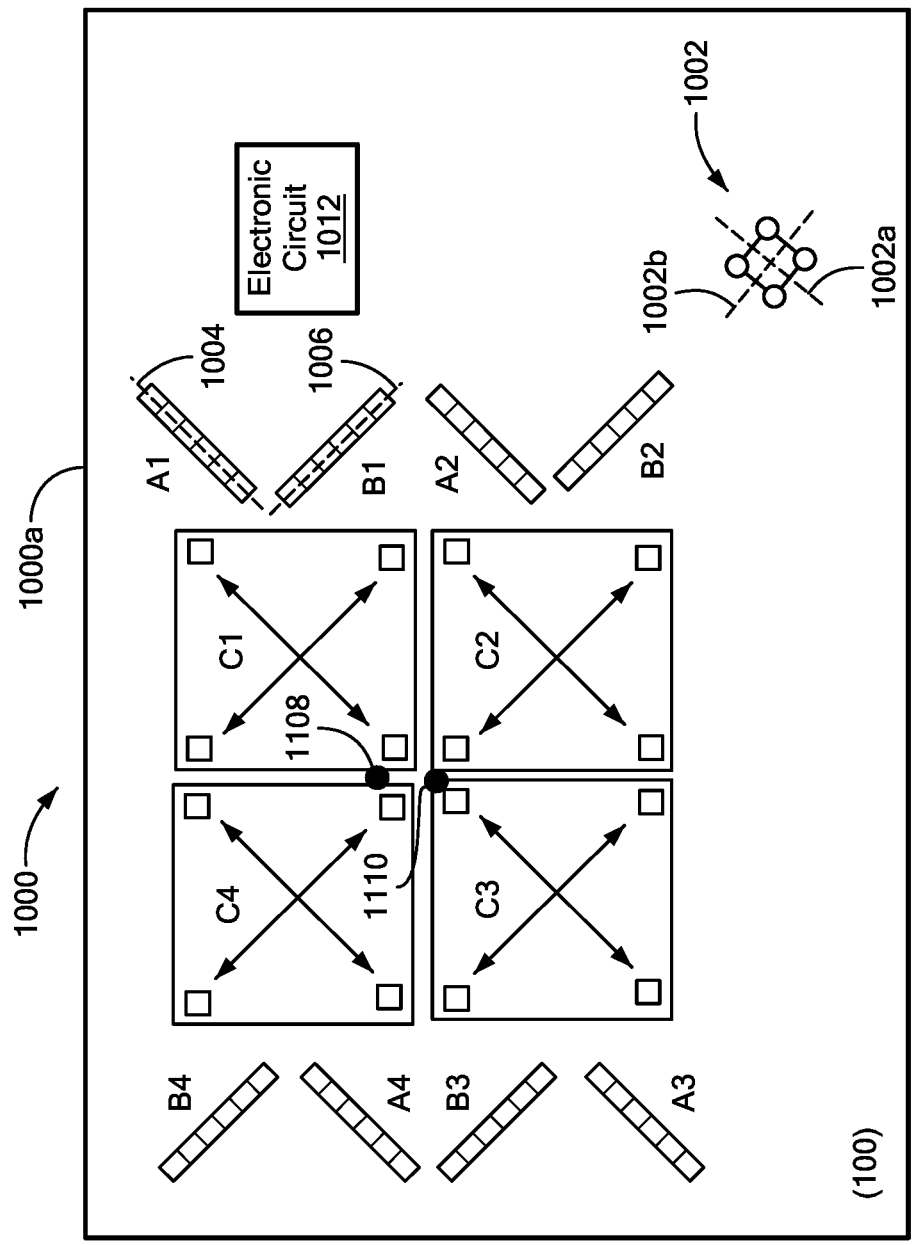
FIG. 10 is a block diagram of another electronic circuit having a silicon substrate, an electronic circuit portion disposed upon the silicon substrate, four planar Hall elements disposed upon the silicon substrate, and eight vertical Hall elements disposed upon the silicon substrate at two different angles relative to a position of a unit cell within the substrate.

Referring now to FIG. 10, in which like elements of FIGS. 1 and 2 are shown having like reference designations, an electronic circuit 1000 can include a substrate 1000a, which can be like the substrate 202 of FIG. 2. A unit cell 1002 can be like the unit cell 100 of FIGS. 1 and 2. A first unit cell axis 1002a can be parallel to two edges of the unit cell 1002. A second unit cell axis 1002b can be parallel to another two edges of the unit cell 1002. The first and second unit cell axes 1002a, 1002b can be ninety degrees apart.

On the substrate 1000a can be disposed a first plurality of vertical Hall elements A1-A4 coupled in a first parallel arrangement by an electronic circuit portion 1012 also disposed upon the substrate 1000a. Each one of the first plurality of vertical Hall elements A1-A4 can have a respective longest dimension and a respective shortest dimension parallel to a first axis 1004, the first axis 1004 also parallel to a major surface of the substrate 1000a. The first axis 1004 is disposed in a direction of between plus five and minus five degrees relative to the crystal axis 1002a. Preferably, the first axis 1004 is disposed in a direction parallel to the crystal axis 1002a. The first plurality of vertical Hall elements A1-A4 taken together has a first geometric centroid 1008 on the major surface of the substrate 1000a.

On the substrate 1000a can also be disposed a second plurality of vertical Hall elements B1-B4 coupled in a second parallel arrangement by the electronic circuit portion 1012. Each one of the second plurality of vertical Hall elements B1-B4 can have a respective longest dimension and a respective shortest dimension parallel to a second axis 1006, the second axis 1006 also parallel to the major surface of the substrate 1000a. An angle between the first axis 1004 and the second axis 1006 is between eighty-five and ninety-five degrees. Preferably, the angle between the first axis 1004 and the second axis 1006 is ninety degrees.

The second plurality of vertical Hall elements B1-B4 taken together has a second geometric centroid 1010 on the major surface of the substrate. The first and second centroids 1008, 1010 can have a separation on the major surface of the substrate 1000a less than half of the longest dimension plus two times the shortest dimension of any one of the first plurality of vertical Hall elements A1-A4 or the second plurality of vertical Hall elements B1-B4. The first and second centroids 1008, 1010 can have a separation on the major surface of the substrate 1000a less than half of the longest dimension of any one of the first plurality of vertical Hall elements A1-A4 or the second plurality of vertical Hall elements B1-B4. In some embodiments, the first and second centroids 1008, 1010 are coincident.

Also disposed upon the substrate 1000a can be a plurality of planar Hall elements C1-C4 coupled in a first parallel arrangement by an electronic circuit portion 1012 also disposed upon the substrate 1000a. The plurality of planar Hall elements C1-C4 taken together has a third geometric centroid (not shown) on the major surface of the substrate 1000a. The third centroid can be coincident with the first centroid 1008, with the second centroid 1010, or with both when they are coincident with each other.

In operation, with the electronic circuit portion 1012, the first plurality of vertical Hall elements A1-A4 and the second plurality of vertical Hall elements B1-B4 can be used to sense two orthogonal spatial components of a magnetic field, i.e., in [100] and [010] directions. Only small orthogonality errors, and small changes of orthogonality errors due to stress, result from the arrangement shown, for reasons described above in conjunction with FIG. 5.

In operation, with the electronic circuit portion 1012, the plurality of planar Hall elements C1-C4 can be used to sense a third spatial component of the magnetic field, i.e., in a [001] direction, orthogonal to the other two spatial components. Thus, the electronic circuit 1000 can be used to sense an amplitude and a direction of a magnetic field in three dimensions. However, in other embodiments, the plurality of planar Hall elements C1-C4 are omitted and the electronic circuit 1000 is used to sense an amplitude and direction of the magnetic field in only two dimensions parallel to a surface of the substrate 1000a.

Examples of electronic circuit portions similar to the electronic circuit portion 1012 are shown below in conjunction with FIGS. 13-15.

In other embodiments, the first plurality of vertical Hall elements can consist of only two vertical Hall elements, can consist of only three vertical Hall elements, or can include more than four vertical Hall elements. Similarly, the second plurality of vertical Hall elements can consist of only two vertical Hall elements, can consist of only three vertical Hall elements, or can include more than four vertical Hall elements. In other embodiments, there can be one, two, three of more than four planar Hall elements.

Further operation of the electronic circuit 1000, and of the electronic circuit portion 1014, is described in conjunction with FIGS. 13-15 below. However, it should be understood that, in combining the first plurality of vertical Hall elements A1-A4 and in combining the second plurality of vertical Hall elements B1-B4, the first plurality of vertical Hall elements A1-A4 can use current spinning and can have different current spinning phases at any time, and the second plurality of vertical Hall elements B1-B4 can also use current spinning and can have different current spinning phases at any time. In some embodiments, the different current spinning phases can be ninety degrees apart using the phase nomenclature designation of FIGS. 12, 12A, 12B and 12C. In some other embodiments, current spinning is not used, yet still the above different phases can be used in a static phase arrangement.

Combinations using different phases can result in lower offset voltages of the combined vertical Hall elements, whether used in a current spinning arrangement or in a static arrangement without current spinning. In some other embodiments, the phases are the same in the first plurality of vertical Hall elements A1-A4 and in the second plurality of vertical Hall elements B1-B4, and the arrangement can be static without current spinning. The plurality of planar Hall elements C1-C4 can have similar combinations of phases and/or current spinning, as will be understood.

It should be understood the elements of the electronic circuit 1000 are not shown to scale but are sized according to clarity.

The first plurality of vertical Hall elements A1-A4 and the second plurality of vertical Hall elements B1-B4 are essentially interdigitated such that vertical Hall elements are arranged in a line having A1, B1, A2, B2 . . . , etc.

Figure 11:
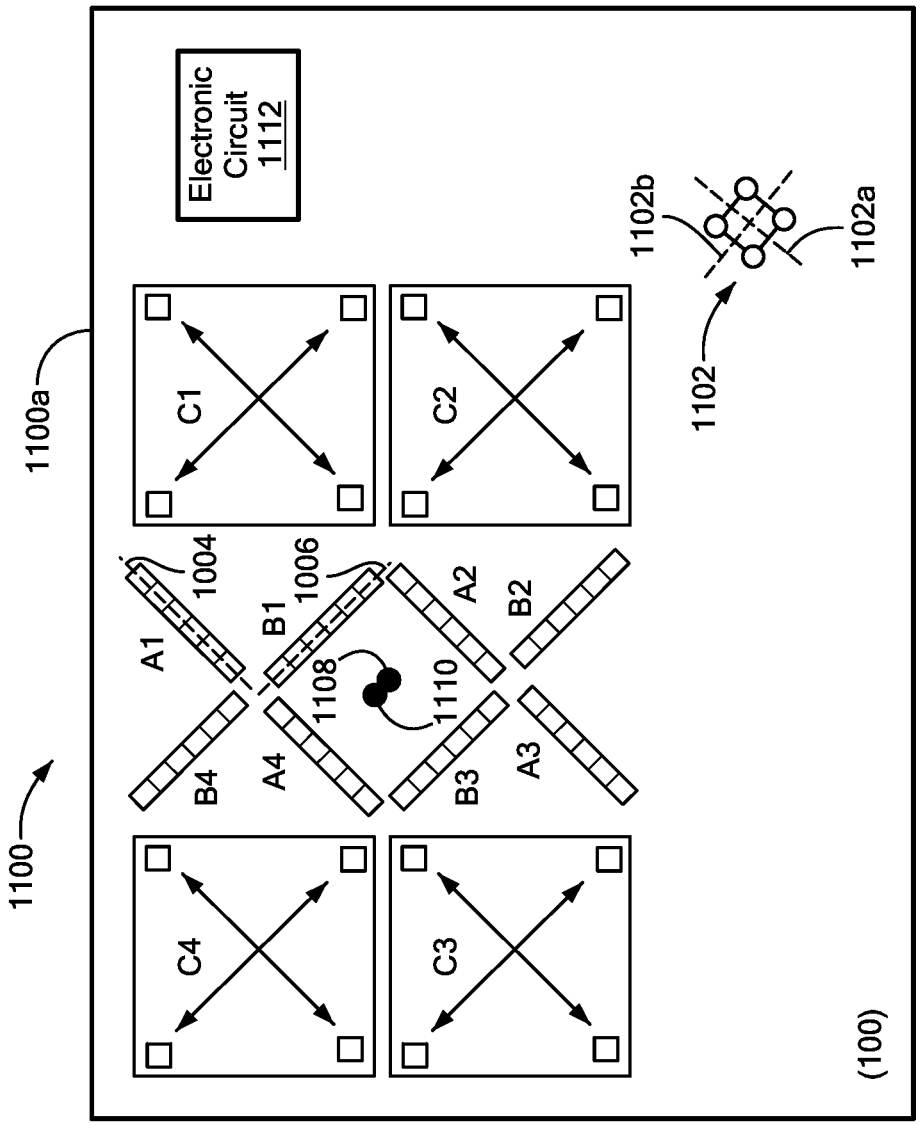
FIG. 11 is a block diagram of another electronic circuit having a silicon substrate, an electronic circuit portion disposed upon the silicon substrate, four planar Hall elements disposed upon the silicon substrate, and eight vertical Hall elements disposed upon the silicon substrate at two different angles relative to a position of a unit cell within the substrate.
Figure 11:
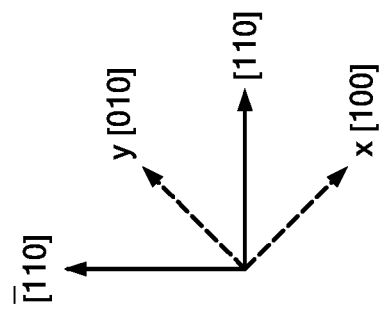

Referring now to FIG. 11, in which like elements of FIGS. 1 and 2 are shown having like reference designations, an electronic circuit 1100 can include a substrate 1100a, which can be like the substrate 202 of FIG. 2. A unit cell 1102 can be like the unit cell 110 of FIGS. 1 and 2. A first unit cell axis 1102a can be parallel to two edges of the unit cell 1102. A second unit cell axis 1102b can be parallel to another two edges of the unit cell 1102. The first and second unit cell axes 1102a, 1102b can be ninety degrees apart.

On the substrate 1100a can be disposed a first plurality of vertical Hall elements A1-A4 coupled in a first parallel arrangement by an electronic circuit portion 1112 also disposed upon the substrate 1100a. Each one of the first plurality of vertical Hall elements A1-A4 can have a respective longest dimension and a respective shortest dimension parallel to a first axis 1104, the first axis 1104 also parallel to a major surface of the substrate 1100a. The first axis 1104 is disposed in a direction of between plus five and minus five degrees relative to the crystal axis 1102a. Preferably, the first axis 1104 is disposed in a direction parallel to the crystal axis 1102a. The first plurality of vertical Hall elements A1-A4 taken together has a first geometric centroid 1108 on the major surface of the substrate 1100a.

On the substrate 1100a can also be disposed a second plurality of vertical Hall elements B1-B4 coupled in a second parallel arrangement by the electronic circuit portion 1112. Each one of the second plurality of vertical Hall elements B1-B4 can have a respective longest dimension and a respective shortest dimension parallel to a second axis 1106, the second axis 1106 also parallel to the major surface of the substrate 1100a. An angle between the first axis 1104 and the second axis 1106 is between eighty-five and ninety-five degrees. Preferably, the angle between the first axis 1104 and the second axis 1106 is ninety degrees.

The second plurality of vertical Hall elements B1-B4 taken together has a second geometric centroid 1110 on the major surface of the substrate. The first and second centroids 1108, 1010 can have a separation on the major surface of the substrate 1100a less than half of the longest dimension plus two times the shortest dimension of any one of the first plurality of vertical Hall elements A1-A4 or the second plurality of vertical Hall elements B1-B4. In some embodiments, the first and second centroids 1108, 1010 can have a separation on the major surface of the substrate 1100a less than half of the longest dimension of any one of the first plurality of vertical Hall elements A1-A4 or the second plurality of vertical Hall elements B1-B4. In some embodiments, the first and second centroids 1108, 1110 are coincident.

Also disposed upon the substrate 1100a can be a plurality of planar Hall elements C1-C4 coupled in a first parallel arrangement by an electronic circuit portion 1112 also disposed upon the substrate 1100a. The plurality of planar Hall elements C1-C4 taken together has a third geometric centroid (not shown) on the major surface of the substrate 1100a. The third centroid can be coincident with the first centroid 1108, with the second centroid 1110, or with both when they are coincident with each other.

In operation, with the electronic circuit portion 1112, the first plurality of vertical Hall elements A1-A4 and the second plurality of vertical Hall elements B1-B4 can be used to sense two orthogonal spatial components of a magnetic field, i.e., in [100] and [010] directions. Only small orthogonality errors, and small changes of orthogonality errors due to stress, result from the arrangement shown, for reasons described above in conjunction with FIG. 5.

In operation, with the electronic circuit portion 1112, the plurality of planar Hall elements C1-C4 can be used to sense a third spatial component of the magnetic field, i.e., in a [001] direction, orthogonal to the other two spatial components. Thus, the electronic circuit 1100 can be used to sense an amplitude and a direction of a magnetic field in three dimensions. However, in other embodiments, the plurality of planar Hall elements C1-C4 are omitted and the electronic circuit 1100 is used to sense an amplitude and direction of the magnetic field in only two dimensions parallel to a surface of the substrate 1100a.

Examples of electronic circuit portions similar to the electronic circuit portion 1112 are shown below in conjunction with FIGS. 13-15.

In other embodiments, the first plurality of vertical Hall elements can consist of only two vertical Hall elements, can consist of only three vertical Hall elements, or can include more than four vertical Hall elements. Similarly, the second plurality of vertical Hall elements can consist of only two vertical Hall elements, can consist of only three vertical Hall elements, or can include more than four vertical Hall elements. In other embodiments, there can be one, two, three of more than four planar Hall elements.

Further operation of the electronic circuit 1100, and of the electronic circuit portion 1114, is described in conjunction with FIGS. 13-15 below. However, it should be understood that, in combining the first plurality of vertical Hall elements A1-A4 and in combining the second plurality of vertical Hall elements B1-B4, the first plurality of vertical Hall elements A1-A4 can use current spinning and can have different current spinning phases at any time, and the second plurality of vertical Hall elements B1-B4 can also use current spinning and can have different current spinning phases at any time. In some embodiments, the different current spinning phases can be ninety degrees apart using the phase nomenclature designation of FIGS. 12, 12A, 12B and 12C. In some other embodiments, current spinning is not used, yet still the above different phases can be used in a static phase arrangement.

Combinations using different phases can result in lower offset voltages of the combined vertical Hall elements, whether used in a current spinning arrangement or in a static arrangement without current spinning. In some other embodiments, the phases are the same in the first plurality of vertical Hall elements A1-A4 and in the second plurality of vertical Hall elements B1-B4, and the arrangement can be static without current spinning. The plurality of planar Hall elements C1-C4 can have similar combinations of phases and/or current spinning, as will be understood.

It should be understood the elements of the electronic circuit 1100 are not shown to scale but are sized according to clarity.

The first plurality of vertical Hall elements A1-A4 and the second plurality of vertical Hall elements B1-B4 are essentially interdigitated such that vertical Hall elements are arranged in a line having A1, B1, A2, B2 . . . , etc.

Figure 12:
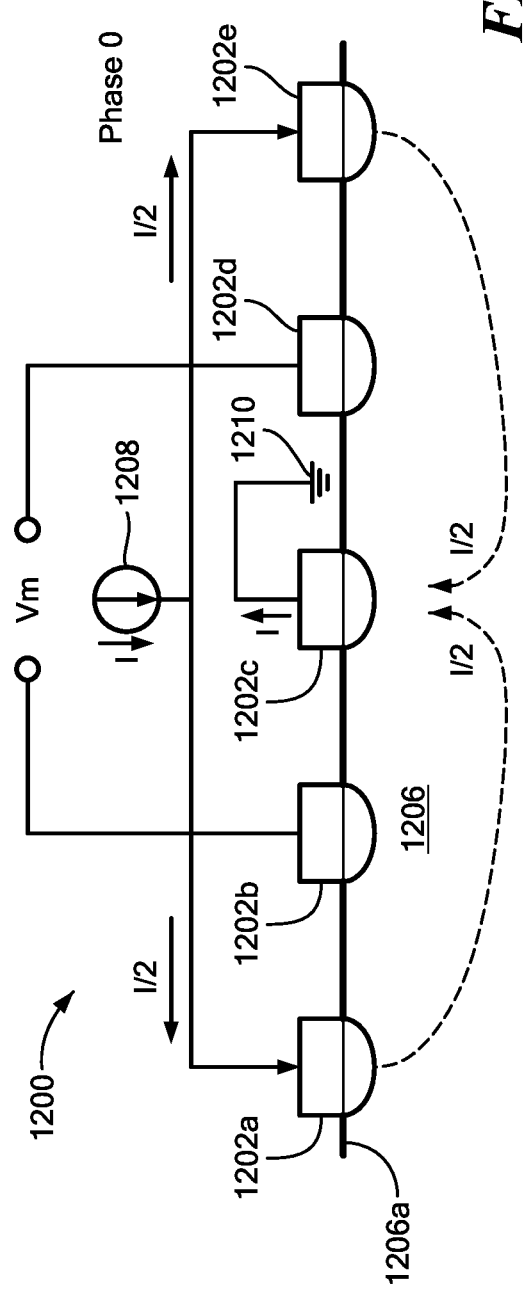
FIGS. 12-12C are side views of a vertical Hall element coupled in four different bias current phases.

Referring now to FIGS. 12-12C, figures are representative of a four phase current spinning (bias current phases) that can be used for a vertical Hall element having five contacts. Alternatively, the figures can be representative of static bias current phases, each phase applicable to different one of a plurality of vertical Hall elements.

Current spinning may or may not be used in embodiments described herein as described in conjunction with FIGS. 6-11. Different static vertical Hall element phases may or may not be used herein, as also described above in conjunction with FIGS. 9-11. The different phases shown in conjunction with FIGS. 12-12C are described herein to be bias current phases rather than current spinning phases to allow for either current spinning or static phase arrangements.

While all embodiments described herein use vertical Hall elements with five contacts, in other embodiments, the vertical Hall elements have any odd number of contacts. As used herein, the term "central contact" refers to a middle contact of an odd number of contacts.

It will be understood that naming conventions described below in terms of 0, 90, 180, and 270 degree phases are somewhat arbitrary. Nevertheless, FIGS. 12, 12A, 12B, and 12C are referred to herein as zero, ninety, one hundred eighty, and two hundred seventy degrees phases, respectively.

Referring now to FIG. 12, a vertical Hall element 1200 can be comprised of five vertical Hall element contacts, namely, first, second, third, fourth, and fifth vertical Hall element contacts, 1202a, 1202b, 1202c, 1202d, 1202e, respectively. In a first bias current phase (zero degree phase), a current source 1208 can be coupled to the first and fifth vertical Hall element contacts 1202a, 1202e, respectively, which are coupled together, and can provide a total current of I, half of the current, I/2, flowing to the first vertical a Hall element contact 1202a and half of the current, I/2, flowing to the fifth vertical Hall element contact 1202e. The third vertical Hall element contact 1202c is coupled to a voltage reference 1210, for example, ground. Currents from the current source 1208 flow from the first and fifth vertical Hall element contacts 1202a, 1202e, respectively, through a substrate 1206 (e.g., through an epitaxial layer upon a substrate) of the CVH sensing element 1200 to the third vertical Hall element contact 1202c, as represented by dashed lines.

A signal, Vm, responsive to an external magnetic field, results between the second and fourth vertical Hall element contacts 1202b, 1202d, respectively.

Figure 12A:
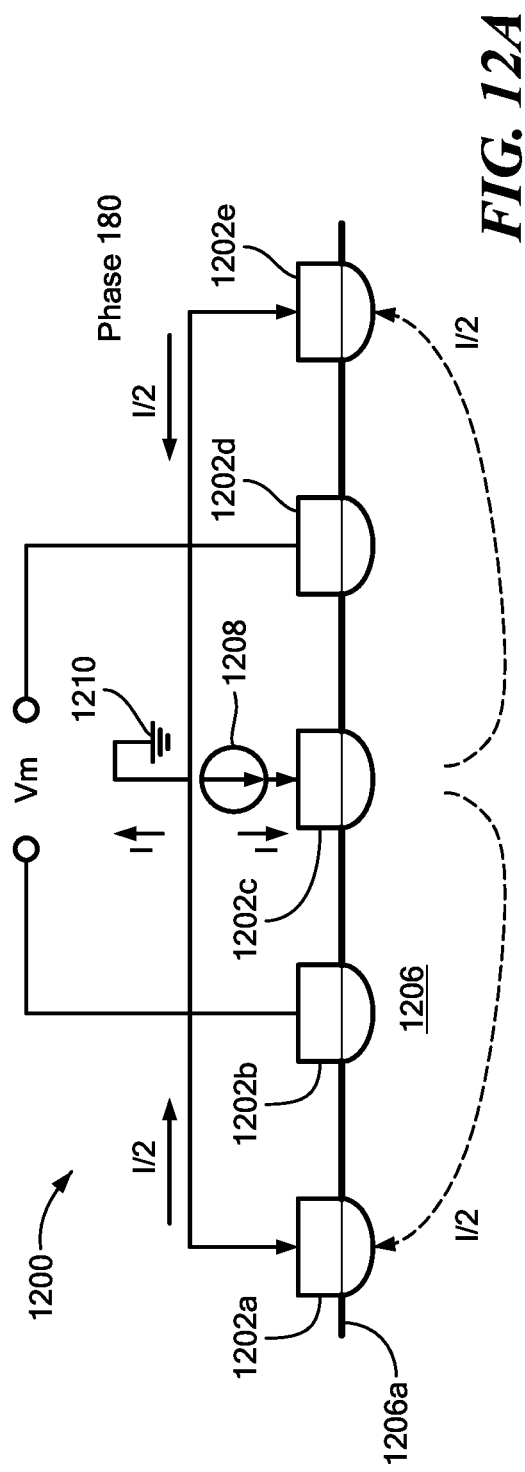

Referring now to FIG. 12A, in which like elements of FIG. 12 are shown having like reference designations, in a second bias current phase (one hundred eighty degree phase) of the same vertical Hall element 1200 (same five vertical Hall element contacts, the current source 1208 is coupled to the third vertical Hall element contact 1202c, and the first and fifth vertical Hal element contacts 1202a, 1202e, respectively, are coupled together and to the reference voltage 1210. Thus, the currents flow through the substrate 1206 in opposite directions from those shown in FIG. 12.

As in FIG. 12, a signal, Vm, responsive to an external magnetic field, results between the second and fourth vertical Hall element contacts, 1202b, 1202d, respectively. The signal, Vm, of FIG. 12A is like the signal, Vm, of FIG. 12. However, the offset voltage within the signals can be different, e.g., different in sign and somewhat different in magnitude.

Referring now to FIG. 12B, in which like elements of FIGS. 12 and 12A are shown having like reference designations, in a third bias current phase (ninety degree phase) upon the same vertical Hall element 1200 (same five vertical Hall element contacts), the current source 1208 is coupled to the second vertical Hall element contact 1202b, and the fourth vertical Hall element contact 1202d is coupled to the reference voltage 1210. Thus, a current flows from the second vertical Hall element contact 1202b through the substrate 1206 to the fourth vertical Hall element contact 1202d.

The first and fifth vertical Hall element contacts 1202a, 1202e, respectively, are coupled together. Some current also flows from the second vertical Hall element contact 1202b through the substrate 1206 to the first vertical Hall element contact 1202a and through the mutual coupling to the fifth vertical Hall element contact 1202e. Some current also flows from the fifth vertical Hall element contact 1202e through the substrate 1206 to the fourth vertical Hall element contact 1202d.

A signal, Vm, responsive to an external magnetic field, results between the first vertical Hall element contact 1202a first (and the fifth vertical Hall element contact 1202e) and the third vertical Hall element contact 1202c. The signal, Vm, of FIG. 12B is like the signal, Vm, of FIGS. 12 and 12A. However, the offset voltage within the signal can be different, e.g., different in sign and somewhat different in magnitude.

Referring now to FIG. 12C, in which like elements of FIGS. 12-12B are shown having like reference designations, in a fourth bias current phase (two hundred seventy degree phase) upon the same vertical Hall element 1200 (same five vertical Hall element contacts) of the CVH sensing element 102, the current is reversed from that shown in FIG. 12B. The current source 1208 is coupled to the fourth vertical Hall element contact 1202d, and the second vertical Hall element contact 1202b is coupled to the reference voltage 1210. Thus, a current flows from the fourth vertical Hall element contact 1202d through the substrate 1206 to the second vertical Hall element contact 1202b.

The first and fifth vertical Hall element contacts 1202a, 1202e, respectively, are coupled together. Some current also flows from the fourth vertical Hall element contact 1202d through the substrate 1206 to the fifth vertical Hall element contact 1202*e*, through the mutual coupling to the first vertical Hall element contact 1202*a*. Some current also flows from the first vertical Hall element contact 1202*a* through the substrate 1206 to the second vertical Hall element contact 1202*b*.

A signal, Vm, responsive to an external magnetic field, results between the first vertical Hall element contact 1202*a* (and the fifth vertical Hall element contact 1202*e*) and the third vertical Hall element contact 1202*c*. The signal, Vm, of FIG. 12C is like the signal, Vm, of FIGS. 12-12B. However, the offset voltage within the signal can be different, e.g., different in sign and somewhat different in magnitude.

The signals, Vm, provided by the four bias current phases of FIGS. 12-12C are responsive to an external magnetic field.

It should be understood that the sequence of bias current phases can be in any order during the current spinning operation, of the bias current phases can be applied to a plurality of vertical Hall elements in any static combination.

Figure 13:
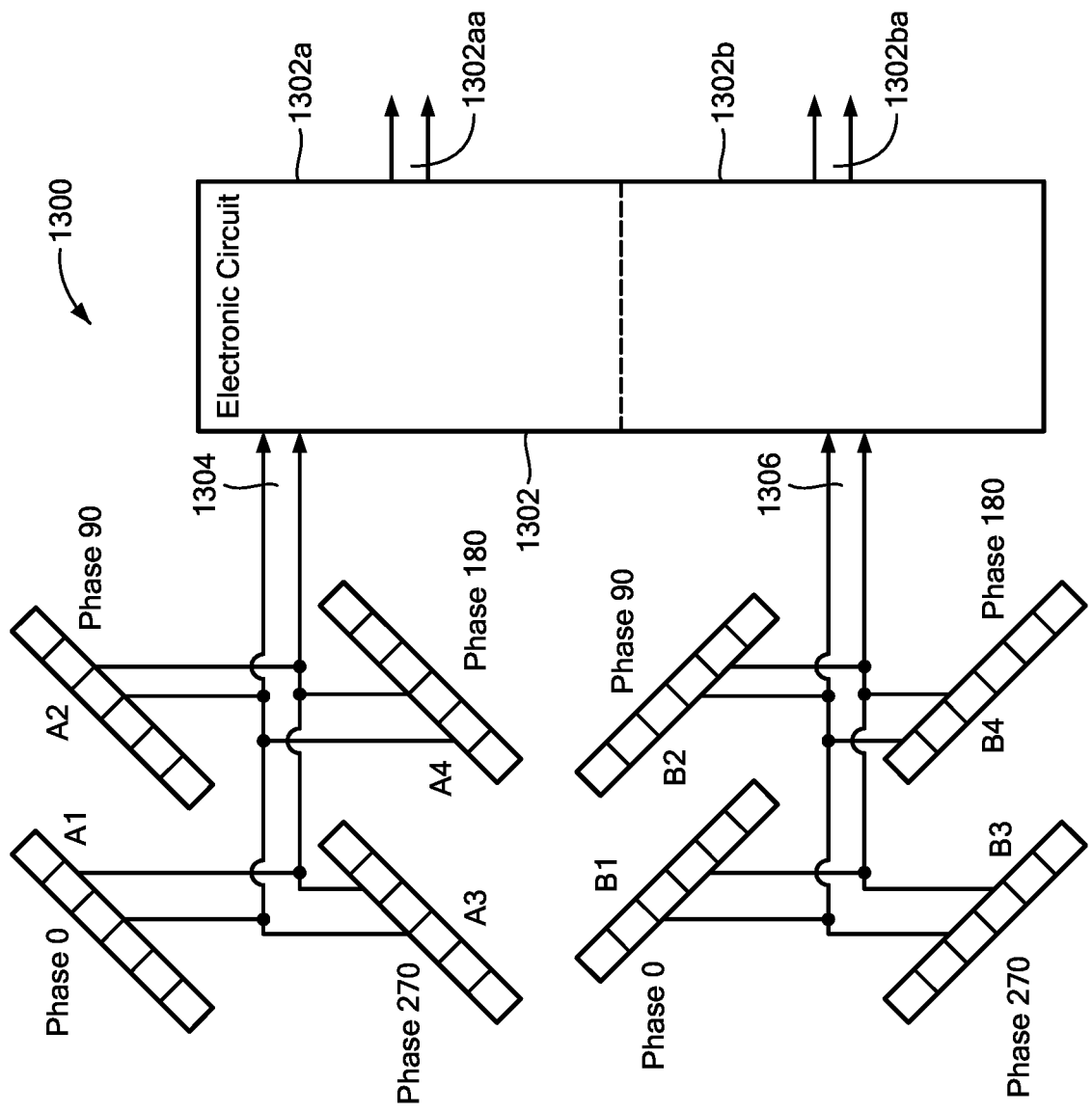
FIG. 13 is a block diagram showing eight vertical Hall elements coupled to an electronic circuit portion similar to a first portion any of the above electronic circuits.

Referring now to FIG. 13, in which like elements of FIGS. 9-11 are shown having like reference designations, a portion 1300 of an electronic circuit can be included in any one of the electronic circuits 900, 1000, or 1100 above.

The first plurality of vertical Hall elements A1-A4 can be coupled in parallel and can provide a first parallel signal 1304 to a first portion 1302*a* of an electronic circuit 1302, which can be included in any of the electronic circuits 912, 1012, or 1112 above. The first parallel signal 1304 can be a differential signal.

The second plurality of vertical Hall elements B1-B4 can be coupled in parallel and can provide a second parallel signal 1306 to a second portion 1302*b* of the electronic circuit 1302. The second parallel signal 1306 can be a differential signal.

The first portion 1302*a* of the electronic circuit 1302 can be operable to generate a signal 1302*aa* associated with the first plurality of vertical Hall elements A1-A4, which signal 1302*aa* is described more fully below in conjunction with FIG. 15.

The second portion 1302*a* of the electronic circuit 1302 can be operable to generate a signal 1302*ba* associated with the second plurality of vertical Hall elements B1-B4, which signal 1302*ba* is described more fully below in conjunction with FIG. 15.

It should be appreciated that, for the electronic circuit 1300 and for electronic circuits described above and below, a lowest distortion of the parallel signals 1304, 1306 can result if a sensed rotating magnetic field has an axis of rotation that intersects the substrate at a point between, and preferably centered between, the first and second centroids, e.g., 612, 614 of FIG. 6, if the first and second centroids are separated, or coincident with the first and second centroids if the first and second centroids are coincident.

Figure 14:
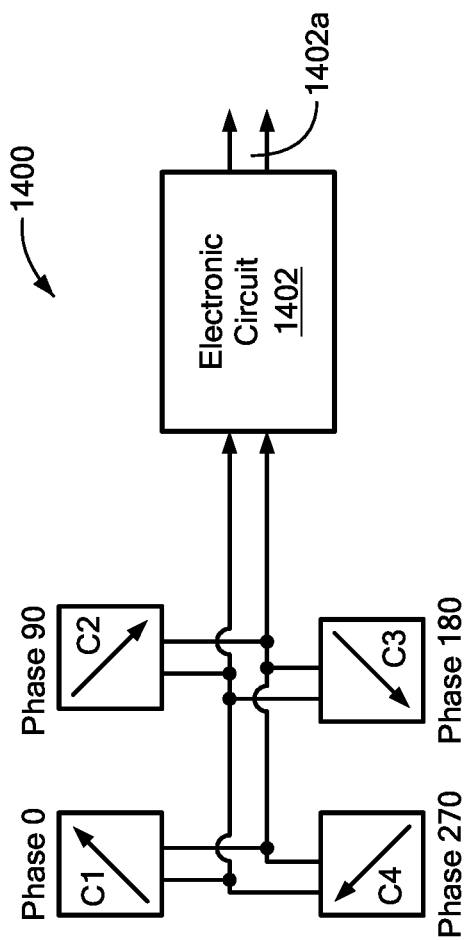
FIG. 14 is a block diagram showing four planar Hall element coupled to an electronic circuit portion similar to a second portion of any of the above electronic circuits.

Referring now to FIG. 14, in which like elements of FIGS. 9-11 are shown having like reference designations, a portion 1400 of an electronic circuit can also be included in any one of the electronic circuits 900, 1000, or 1100 above.

The first plurality of planar Hall elements C1-C4 can be coupled in parallel and can provide a third parallel signal to an electronic circuit 1402, which can be included in any of the electronic circuits 912, 1012, or 1112 above.

The of the electronic circuit 1402 can be operable to generate a signal 1402*a* associated with the plurality of planer Hall elements C1-C4, which signal 1402*a* is described more fully below in conjunction with FIG. 15.

Figure 15:
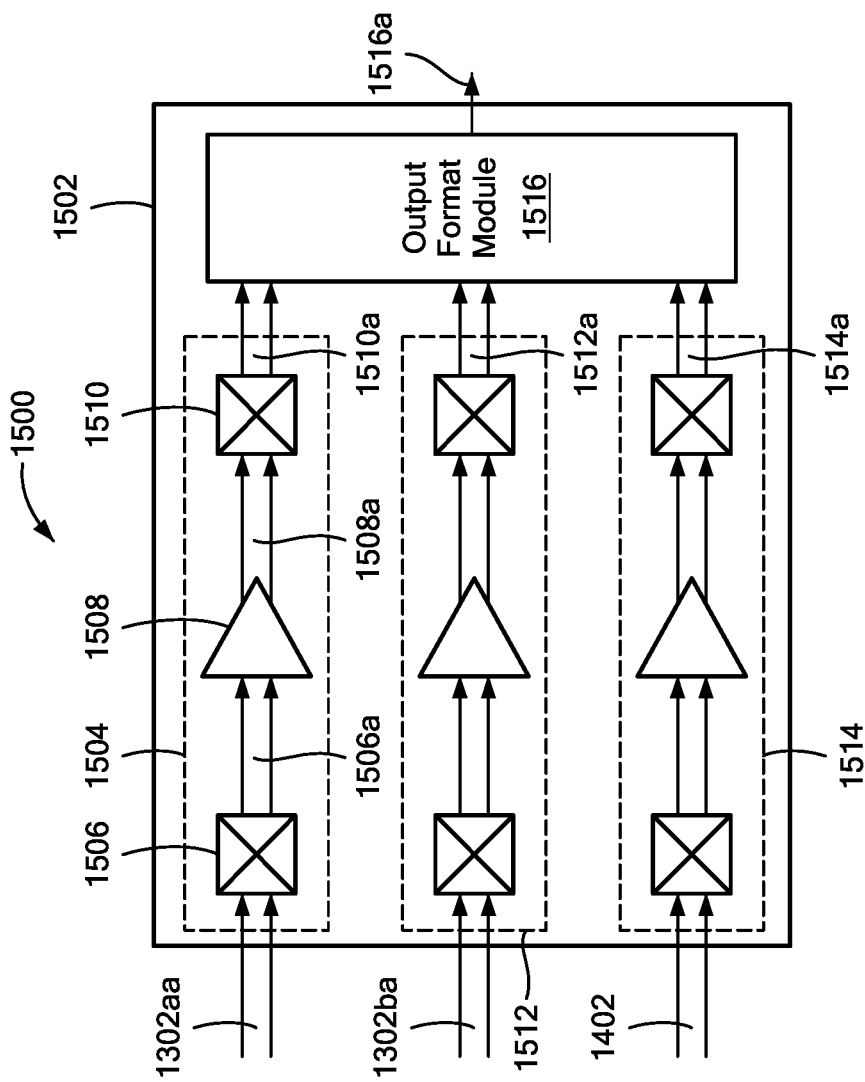
FIG. 15 is a block diagram showing further details of the first and second portions of the electronic circuit portions of FIGS. 13 and 14 and showing an output format module.

Referring now to FIG. 15, in which like elements of FIGS. 13 and 14 are shown having like reference designations, a portion 1500 of an electronic circuit can also be included in any one of the electronic circuits 900, 1000, or 1100 above.

The portion 1500 can include an electronic circuit 1502. The electronic circuit 1502 can be coupled to the signals 1302*aa*, 1302*ba*, 1402*a* of FIGS. 13 and 14 in three circuit channels 1504, 1512, 1514, respectively.

The circuit channels 1504, 1512, 1514 can be similar, and thus, only the circuit channel 1504 is described here. It will be understood that the circuit channels 1504, 1512, 1514 can generate signals representative of sensed magnetic fields in x, y, and z directions, respectively.

The circuit channel 1504 can form a chopper stabilized amplifier in which a modulator 1506 is coupled to the signal 1302*aa*, the modulator 1506 operable to generate a differential modulated signal 1506*a* being a version of the signal 1302*aa* but having frequency components shifted to a higher frequency in accordance with a switching frequency of the modulator 1506.

An amplifier 1508 can be coupled to the modulated signal 1506*a* and can generate and amplified signal 1508*a*. Another modulator 1510 can be coupled to the amplified signal 1508*a*, the modulator 1510 operable to generate a differential demodulated signal 1510*a* being a version of the amplified signal 1508*a* but having frequency components shifted to a lower frequency in accordance with a switching frequency of the modulator 1510. As a result of the two modulators, 1506, 1510, the differential demodulated signal 1510*a* has frequency components at the same frequencies as those within the signal 1302*aa*.

The dual modulation of the chopper stabilized amplifier of the circuit channel 1504 will be recognized to reduce a DC error component within the signal 1302*aa* and also a DC error component generated by the amplifier 1508.

A demodulated signal 1512*a* can be generated by the circuit channel 1512, which demodulated signal 1512*a* can be associated with the signal 1302*ba*.

A demodulated signal 1514*a* can be generated by the circuit channel 1514, which demodulated signal 1514*a* can be associated with the signal 1402.

The differential demodulated signals 1510*a*, 1512*a*, 1514*a* can be coupled to an output format module 1516. The output format module 1516 can be operable to generate a formatted signal 1516*a* having information about each one of the signals 1302*aa*, 1302*ba*, 1402*ba*. In some embodiments, the formatted signals 1516*a* can have a SENT format, a CAN format, or any other format, digital, analog, serial or parallel.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An electronic circuit, comprising:
    a substrate having a major surface, the substrate comprising a plurality of unit crystal cells, the plurality of unit crystal cells having a crystal axis parallel to an edge of one of the plurality of unit crystal cells and parallel to the major surface of the substrate;
    a first plurality of vertical Hall elements coupled in a first parallel arrangement, each one of the first plurality of vertical Hall elements having a respective longest dimension and a respective shortest dimension parallel to a first axis, the first axis parallel to the major surface of the substrate, wherein the first axis is disposed in a direction of between plus five and minus five degrees relative to the crystal axis, wherein the first plurality of vertical Hall elements taken together has a first geometric centroid on the major surface of the substrate; and
    a second plurality of vertical Hall elements coupled in a second parallel arrangement, each one of the second plurality of vertical Hall elements having a respective longest dimension and a respective shortest dimension parallel to a second axis, the second axis parallel to the major surface of the substrate, wherein an angle between the first and second axes is between eighty-five and ninety-five degrees, wherein the second plurality of vertical Hall elements taken together has a second geometric centroid on the major surface of the substrate, wherein the first and second centroids have a separation on the major surface of the substrate less than half of the longest dimension plus two times the shortest dimension of any one of the first plurality or the second plurality of vertical Hall elements.

2. The electronic circuit of claim 1, wherein the first plurality of vertical Hall elements comprises a first two vertical Hall elements and the second plurality of vertical Hall elements comprises a second two vertical Hall elements.

3. The electronic circuit of claim 1, wherein the first plurality of vertical Hall elements comprises a first four vertical Hall elements and the second plurality of vertical Hall elements comprises a second four vertical Hall elements.

4. The electronic circuit of claim 1, wherein the first and second centroids are at a same point on the major surface of the substrate.

5. The electronic circuit of claim 4, wherein the first plurality of vertical Hall elements comprises a first four vertical Hall elements and the second plurality of vertical Hall elements comprises a second four vertical Hall elements.

6. The electronic circuit of claim 1, wherein the first and second pluralities of vertical Hall elements are disposed in an interdigitated arrangement such that ones of the first plurality of vertical Hall elements are disposed between ones of the second plurality of vertical Hall elements.

7. The electronic circuit of claim 6, wherein the first plurality of vertical Hall elements comprises a first four vertical Hall elements and the second plurality of vertical Hall elements comprises a second four vertical Hall elements.

8. The electronic circuit of claim 1, further comprising:
    a planar Hall element disposed on the major surface of the substrate, wherein the planar Hall element has a third geometric centroid.

9. The electronic circuit of claim 8, wherein the first plurality of vertical Hall elements and the second plurality of vertical Hall elements are proximate to and surround the planar Hall element, and wherein the first, second, and third centroids are at a same point on the major surface of the substrate.

10. The electronic circuit of claim 9, wherein the first plurality of vertical Hall elements comprises a first four vertical Hall elements and the second plurality of vertical Hall elements comprises a second four vertical Hall elements.

11. The electronic circuit of claim 8, wherein the first plurality of vertical Hall elements and the second plurality of vertical Hall elements surround the planar Hall element, wherein the first and second pluralities of vertical Hall elements are disposed in an interdigitated arrangement such that ones of the first plurality of vertical Hall elements are disposed between ones of the second plurality of vertical Hall elements.

12. The electronic circuit of claim 11, wherein the first plurality of vertical Hall elements comprises a first four vertical Hall elements and the second plurality of vertical Hall elements comprises a second four vertical Hall elements.

13. The electronic circuit of claim 1, further comprising:
    a plurality of planar Hall elements coupled in parallel and disposed on the major surface of the substrate, wherein the plurality of planar Hall element taken together has a third geometric centroid.

14. The electronic circuit of claim 13, wherein the plurality of planar Hall elements comprises four planar Hall elements.

15. The electronic circuit of claim 14, wherein the first plurality of vertical Hall elements comprises a first four vertical Hall elements and the second plurality of vertical Hall elements comprises a second four vertical Hall elements.

16. The electronic circuit of claim 15, wherein the first, second, and third centroids are at a same point on the major surface of the substrate.

17. The electronic circuit of claim 16, wherein the first plurality of vertical Hall elements and the second plurality of vertical Hall elements are disposed between ones of the plurality of planar Hall elements.

18. The electronic circuit of claim 16, wherein each one of the first plurality of vertical Hall elements is electrically coupled in a different respective phase at any particular time, and wherein each one of the second plurality of vertical Hall element is electrically coupled in a different respective phase at any particular time.

19. The electronic circuit of claim 18, wherein each one of the plurality of planar Hall elements is electrically coupled in a different respective phase at any particular time.

20. The electronic circuit of claim 18, wherein the first plurality of vertical Hall elements and the second plurality of vertical Hall elements are disposed between ones of the plurality of planar Hall elements.

21. The electronic circuit of claim 15, wherein the first and second pluralities of vertical Hall elements are disposed in an interdigitated arrangement such that ones of the first plurality of vertical Hall elements are disposed between ones of the second plurality of vertical Hall elements.

22. The electronic circuit of claim 21, wherein each one of the first plurality of vertical Hall elements is electrically coupled in a different respective phase at any particular time, and wherein each one of the second plurality of vertical Hall element is electrically coupled in a different respective phase at any particular time.

23. The electronic circuit of claim 22, wherein each one of the plurality of planar Hall elements is electrically coupled in a different respective phase at any particular time.

24. The electronic circuit of claim 15, wherein each one of the first plurality of vertical Hall elements is electrically coupled in a different respective phase at any particular time, and wherein each one of the second plurality of vertical Hall element is electrically coupled in a different respective phase at any particular time.

25. The electronic circuit of claim 24, wherein each one of the plurality of planar Hall elements is electrically coupled in a different respective phase at any particular time.

26. The electronic circuit of claim 1, wherein each separation between each respective center of each one of the first plurality of vertical Hall elements and other ones of the centers of the first plurality of vertical Hall elements is greater than half the longest dimension of any one of the first plurality of vertical Hall elements and wherein each separation between each respective center of each one of the second plurality of vertical Hall elements and other ones of the centers of the second plurality of vertical Hall elements is greater than half the longest dimension of any one of the second plurality of vertical Hall elements.

* * * * *

UNITED STATES PATENT AND TRADEMARK OFFICE
CERTIFICATE OF CORRECTION

PATENT NO. : 11,555,868 B2
APPLICATION NO. : 17/238543
DATED : January 17, 2023
INVENTOR(S) : Hernán D. Romero et al.

It is certified that error appears in the above-identified patent and that said Letters Patent is hereby corrected as shown below:

In the Specification

Column 1, Line 45 delete "and accuracy" and replace with --an accuracy--.

Column 3, Lines 12-13 delete "element FIG. 5" and replace with --element; FIG. 5--.

Column 3, Line 17 delete "n" and replace with --circuit portion--.

Column 3, Line 56 delete "portion any" and replace with --portion of any--.

Column 5, Line 17 delete "A used" and replace with --As used--.

Column 6, Line 19 delete "wafer 200a" and replace with --wafer 200--.

Column 7, Line 14 delete "310 can" and replace with --310, 312 can--.

Column 7, Line 59 delete "elements 504, 506" and replace with --elements 508, 510--.

Column 8, Line 11 delete "the the" and replace with --the--.

Column 8, Line 36 delete "element 508, 510" and replace with --elements 508, 510--.

Column 10, Line 64 delete "714," and replace with --716,--.

Column 11, Line 40 delete "6081," and replace with --608a,--.

Column 13, Line 22 delete ", three of" and replace with --, three or--.

Column 13, Line 25 delete "portion 914," and replace with --portion 912,--.

Signed and Sealed this
Twenty-sixth Day of December, 2023

Katherine Kelly Vidal
*Director of the United States Patent and Trademark Office*

Column 14, Line 7 delete "1008" and replace with --1108--.

Column 14, Line 21 delete "1010" and replace with --1110--.

Column 14, Line 23 delete "1008, 1010" and replace with --1108, 1110--.

Column 14, Line 28 delete "1008, 1010" and replace with --1108, 1110--.

Column 14, Line 33 delete "1008, 1010" and replace with --1108, 1110--.

Column 14, Line 41 delete "1008, with the second centroid 1010," and replace with --1108, with the second centroid 1110,--.

Column 15, Line 5 delete ", three of" and replace with --, three or--.

Column 15, Line 8 delete "1014," and replace with --1012,--.

Column 15, Line 44 delete "cell 110" and replace with --cell 100--.

Column 16, Line 10 delete "1108, 1010" and replace with --1108, 1110--.

Column 16, Line 15 delete "1108, 1010" and replace with --1108, 1110--.

Column 16, Line 60 delete ", three of" and replace with --, three or--.

Column 16, Line 63 delete "1114," and replace with --1112,--.

Column 17, Line 32 delete "to different" and replace with --to a different--.

Column 17, Line 51 delete "degrees" and replace with --degree--.

Column 17, Line 61 delete "vertical a Hall" and replace with --vertical Hall--.

Column 18, Line 12 delete "contacts," and replace with --contacts)--.

Column 18, Line 14 delete "Hal" and replace with --Hall--.

Column 18, Line 58 delete "102," and replace with --1200,--.

Column 19, Line 20 delete "of the" and replace with --and the--.

Column 19, Line 42 delete "1302a" and replace with --1302b--.

Column 19, Line 66 delete "planer" and replace with --planar--.

Column 20, Line 23 delete "and amplified" and replace with --an amplified--.

CERTIFICATE OF CORRECTION (continued)
U.S. Pat. No. 11,555,868 B2

Column 20, Line 47 delete ", 1402ba." and replace with --, 1402.--.

In the Claims

Column 22, Line 27 delete "Hall element" and replace with --Hall elements--.

Column 22, Line 66 delete "element" and replace with --elements--.

Column 23, Line 8 delete "element" and replace with --elements--.